(12) United States Patent
Sri Gopala Krishna Murthi et al.

(10) Patent No.: US 10,884,048 B2
(45) Date of Patent: Jan. 5, 2021

(54) SYSTEMS AND METHODS FOR DETERMINING A TIME DELAY IN ELECTRICAL POWER SYSTEMS

(71) Applicant: General Electric Technology GmbH, Baden (CH)

(72) Inventors: Sankara Subramanian Sri Gopala Krishna Murthi, Stafford (GB); Hengxu Ha, Stafford (GB)

(73) Assignee: GENERAL ELECTRIC TECHNOLOGY GMBH, Baden (CH)

( * ) Notice: Subject to any disclaimer, the term of this patent is extended or adjusted under 35 U.S.C. 154(b) by 274 days.

(21) Appl. No.: 15/769,832

(22) PCT Filed: Oct. 20, 2016

(86) PCT No.: PCT/EP2016/075272
§ 371 (c)(1),
(2) Date: Apr. 20, 2018

(87) PCT Pub. No.: WO2017/068067
PCT Pub. Date: Apr. 27, 2017

(65) Prior Publication Data
US 2020/0209299 A1 Jul. 2, 2020

(51) Int. Cl.
| | |
|---|---|
| *G01R 31/08* | (2020.01) |
| *H02H 1/00* | (2006.01) |
| *H02H 3/28* | (2006.01) |
| *H04J 3/06* | (2006.01) |
| *H02H 7/26* | (2006.01) |

(52) U.S. Cl.
CPC ......... *G01R 31/085* (2013.01); *H02H 1/0061* (2013.01); *H02H 3/28* (2013.01); *H04J 3/06* (2013.01); *H02H 7/26* (2013.01)

(58) Field of Classification Search
CPC ...... G01R 31/08; G01R 31/086; H02H 3/083; H02H 7/00; H02H 7/262; H04J 3/0638; H04J 3/0682; H04L 7/0008
See application file for complete search history.

(56) References Cited

U.S. PATENT DOCUMENTS

| | | | |
|---|---|---|---|
| 8,942,108 B2* | 1/2015 | Pan ..................... | H04L 41/0686 370/242 |
| 9,893,873 B2* | 2/2018 | Ha .......................... | H02H 7/00 |

(Continued)

*Primary Examiner* — Minh N Tang
(74) *Attorney, Agent, or Firm* — Eversheds Sutherland (US) LLP

(57) ABSTRACT

Systems and methods of determining a communication time delay in electrical power systems are provided. In one embodiment, a method of determining a communication time delay in a communication network between a local terminal and each of a plurality of remote terminals in a multi-terminal multi-junction electrical power system includes: (a) calculating a respective initial communication time delay between each remote terminal and the local terminal; (b) calculating a respective junction time delay between respective first, second and third pairs of adjacent junctions; and (c) correcting the calculated initial communication time delay of each remote terminal spaced from the local terminal by two or more junctions according to each corresponding junction time delay arising between the or each remote terminal and the local terminal.

20 Claims, 6 Drawing Sheets

(56) References Cited

U.S. PATENT DOCUMENTS

2013/0181755 A1\* 7/2013 Li .......................... H02H 3/30
 327/156
2014/0118000 A1\* 5/2014 Pan ....................... H02H 7/263
 324/537

\* cited by examiner

SYSTEMS AND METHODS FOR DETERMINING A TIME DELAY IN ELECTRICAL POWER SYSTEMS

FIELD OF THE INVENTION

This invention relates to a method of determining a communication time delay in a communication network between a local terminal and each of a plurality of remote terminals in a multi-terminal multi junction electrical power system.

BACKGROUND

Synchronization techniques play a very important role in line differential protection schemes which help to protect transmission lines within an electrical power system by identifying when a fault occurs in relation to the transmission lines. The basic principle of line differential protection is based on a comparison of a differential current (which is the direct summation of current samples or phasors of both a local and a remote terminal in the electrical power system) with a bias current (which is the summation of the amplitude of currents of both the local and remote terminals), that is:

$$\begin{cases} I_{\mathit{diff}} = |\dot{I}_L + \dot{I}_R| \\ I_{bias} = \frac{1}{2}(|\dot{I}_L| + |\dot{I}_R|) \end{cases}$$

where
$I_{\mathit{diff}}$ is differential current;
$I_{bias}$ is bias current;
$I_L$ is measured current at the local terminal; and
$I_R$ is the measured current received from the remote terminal.

If the received current from the remote terminal is strictly synchronized with the local current, then the differential current should be very small (theoretically zero) as there is no internal fault on the interconnecting transmission line. However, one must consider the time latency of the received current samples from the remote terminal compared with the current samples of the local terminal due to a delay imparted by communication of the measured current at the remote terminal from the remote terminal to the local terminal, and also the un-synchronized sampling of the current at the remote terminal. This time latency can lead to a significant increase in differential current, which in turn can result in mal-operation of the differential protection if an external fault occurs.

It is, therefore, necessary to employ a synchronization technique to enable time alignment of the local terminal current with the received current from the remote terminal. Traditionally Global Positioning System (GPS) based and echo-based processes, such as so-called 'Ping-Pong' techniques, have been used for synchronization, where GPS functions as the dominant synchronization element and Ping-Pong as a backup.

It is evident that GPS can provide synchronization which is adaptive not only for non-switched but also for switched communication networks. However, it is very costly and additionally, if the GPS signal is lost, it can lead to mal-operation. Meanwhile the Ping-Pong technique can only function correctly for non-switched networks where the forward and return communication paths are the same (i.e. the time delay from the local terminal to the remote terminal is the same as the delay from the remote terminal to the local terminal).

SUMMARY

According to an aspect of the invention there is provided a method of determining a communication time delay in a communication network between a local terminal and each of a plurality of remote terminals in a multi-terminal multi junction electrical power system comprising the steps of:
  (a) calculating a respective initial communication time delay between each remote terminal and the local terminal;
  (b) calculating a respective junction time difference between the or each respective pair of adjacent junctions; and
  (c) correcting the calculated initial communication time delay of the or each remote terminal spaced from the local terminal by two or more junctions according to the or each corresponding junction time difference arising between the or each said remote terminal and the local terminal.

Determining a respective communication time delay between a local terminal and each of a plurality of remote terminals in a multi-terminal multi junction electrical power system permits subsequent time alignment of the local terminal current with the received current from each remote terminal, and hence the synchronization of these currents that is necessary to permit operation of a differential protection scheme.

Moreover, the method of the invention facilitates such operation of a differential protection scheme without the need for costly GPS infrastructure, or an echo-based process such as Ping-Pong which is limited to certain communication network topologies, i.e. only non-switched (i.e. balanced) networks.

In addition, the calculation of one or more respective junction time differences and the subsequent use of these to correct a calculated initial communication time delay means that the method of the invention is readily scalable and can be easily adapted to different topologies of multi-terminal, multi junction electrical power systems.

Preferably step (a) of calculating a respective initial communication time delay between each remote terminal and the local terminal includes:
  (a) selecting, in respect of each remote terminal a calculation node in the electrical power network;
  (b) calculating respective node currents flowing into the corresponding calculation node from each remote terminal;
  (c) equating, in respect of each remote terminal, a sum of node currents flowing into the corresponding calculation node to zero according to Kirchhoff's first law; and
  (d) extracting, in respect of each remote terminal, an initial communication time delay between the local terminal and the said respective remote terminal from a corresponding equated sum of node currents.

Equating, in respect of each remote terminal, a sum of node currents flowing into the corresponding calculation node to zero (and thereafter extracting an initial communication time delay from such an equated sum of node currents), i.e. utilising Kirchhoff's first law, is advantageous because it helps to isolate the method of the invention, and the or each initial communication time delay obtained thereby, from errors which might otherwise adversely affect the aforementioned differential current $I_{diff}$ and thereafter lead to erroneous activation of an associated differential protection scheme.

In particular, a consideration instead of differences in calculated voltages at a chosen calculation node in an electrical power system in order to establish an initial communication time delay can create a larger error in the differential current $I_{diff}$ value calculated therefrom as a result of only minor errors in the calculated voltages.

Optionally the step of calculating respective node currents flowing into the corresponding calculation node from each remote terminal includes calculating in respect of each remote terminal a corresponding remote node current flowing into the corresponding calculation node from the said remote terminal and calculating in respect of the local terminal an equivalent node current for each remote terminal representative of the current flowing into the corresponding calculation node from the corresponding remote terminal.

The calculation of remote node currents and equivalent node currents provides the method of the invention with a desired degree of scalability and so permits its use with a wide range of different electrical power system configurations having, e.g. a significantly different number of remote terminals and/or junctions interconnecting those remote terminals.

In a preferred embodiment of the invention:

each equivalent node current is calculated by the local terminal;

each remote node current is calculated by the corresponding remote terminal and is thereafter transmitted via the communication network to the local terminal whereat it is received as a corresponding received remote node current; and the step of equating, in respect of each remote terminal, a sum of node currents flowing into the corresponding calculation node to zero according to Kirchhoff's first law, includes equating to zero in respect of each remote terminal the sum of the corresponding calculated equivalent node current and the corresponding remote node current.

The foregoing steps desirably incorporate within each corresponding sum of node currents an initial communication time delay which represents the amount of time taken for the given calculated remote node current to travel (via the communication network) from the associated remote terminal to the chosen calculation node.

Calculating in respect of the local terminal an equivalent node current for each remote terminal may include:

establishing an equivalent admittance for each remote terminal;

obtaining a local node current; and utilising the established equivalent admittances for each remote terminal and the local node current to calculate the corresponding equivalent node current.

The utilisation of established equivalent admittances for each remote terminal and the local node current to calculate the corresponding equivalent node current has the benefit of removing from such a calculation any unknowns, e.g. regarding the status of current flow, in respect of each corresponding equivalent node current, and so permits subsequently the ready extraction of a corresponding initial communication time delay since the associated equated sum of node currents can be manipulated to include only one unknown, i.e. the required initial communication time delay.

In a method according to another preferred embodiment of the invention utilising the established equivalent admittances for each remote terminal and the local node current to calculate the corresponding equivalent node current includes one of:

multiplying the local node current by a current distribution coefficient based on the said established equivalent admittances; and (a) adding one or more other node currents, the or each of which is determined from the equivalent admittance of another remote terminal and a corresponding node voltage calculated in respect of the local terminal, to the local node current.

Such steps desirably calculate each corresponding equivalent node current in a manner that can be readily scaled according to the number of remote terminals included in the particular electrical power system to which the method of the invention is applied.

Calculating a respective junction time difference between the or each respective pair of adjacent junctions may include:

(a) initially aligning the corresponding calculated expected voltage of each remote terminal with the calculated expected voltage of the local terminal;

(b) calculating for the local terminal and each remote terminal an expected current at the junction with which it is connected;

(c) initially aligning the corresponding calculated expected current of each remote terminal with the calculated expected current of the local terminal;

(d) calculating a junction voltage at each junction based on the aforesaid initially aligned expected voltages and expected currents of the remote terminals and the local terminal; and (e) extracting a respective junction time difference for the or each respective pair of adjacent junctions from a comparison of the calculated junction voltages of the or each said pair of adjacent junctions.

Such steps can all be carried out without further recourse to an external synchronizing element such as a GPS or Ping-Pong based process, and so permits the or each respective junction time difference to be calculated in a manner which maintains the independence of the method of the invention from such external elements. In addition, such steps are scalable for any number of terminals, any number of junctions and differing topologies of the electrical power system.

Preferably initially aligning the corresponding calculated expected voltage of each remote terminal with the calculated expected voltage at the local terminal and initially aligning the corresponding expected current of each remote terminal with the calculated expected current at the local terminal includes:

(a) identifying the maximum initial communication time delay;

(b) calculating a correction factor for each of the calculated expected voltage and calculated expected current of each terminal by subtracting the corresponding initial communication time delay for the said terminal from the maximum initial communication time delay; and (c) applying the corresponding correction factor to the calculated expected voltage and the calculated expected current of each terminal.

The foregoing steps can be readily implemented while desirably achieving the required initial alignment.

Optionally calculating a junction voltage at each junction based on the aforesaid initially aligned calculated expected voltages and expected currents of the remote terminals and the local terminal includes considering the voltage and current at a preceding junction.

Considering the voltage and current at a preceding junction, i.e. an adjacent junction from which current is received during operation of the electrical power system in which the junctions are located, permits calculation of the junction voltage in a manner that obviates the need for any external synchronization.

In another preferred embodiment of the invention considering the voltage and current at a preceding junction includes summing the calculated expected current of the or each terminal connected to the preceding junction with the current received from the previously preceding junction to calculate the current provided by the preceding junction to the junction of interest.

Such steps again similarly avoid the need for any external synchronization.

The current received from the previously preceding junction may be calculated according to:

$$i_k(t) = [f_{k-1}(t-2Tc)*K - b_{k-1}(t)/K]/2zc$$

where $$f_{k-1}(t) = v_{k-1}(t) + zc*i_{k-1}(t-Tz); \text{ and}$$

$$b_{k-1}(t) = v_{k-1}(t) - zc*i_{k-1}(t-Tz)$$

and
k is the junction of interest;
k−1 is the preceding junction;

$$zc = \text{abs}(\text{sqrt}(z_1/y_1));$$

$$Tz = \text{phase }[\text{sqrt}(z_1/y_1)]/(2\pi f_0);$$

$$K = \exp[-\text{real}(\text{sqrt}(z_1*y_1)*1)]; \text{ and}$$

$$Tc = \text{imag}[(\text{sqrt}(z_1*y_1)*1)]//(2\pi f_0);$$

with
$f_0$ being the fundamental frequency of the electrical power system;
l being the section length of transmission medium from the preceding junction to the junction of interest;
$z_1$ being the series impedance per unit length of the transmission medium from the preceding junction to the junction of interest; and
$y_1$ being the shunt admittance per unit length of the transmission medium from the preceding junction to the junction of interest.

Alternatively the current received from the previously preceding junction may be calculated according to:

$$i_k = C\dot{V}_{k-1} + D\dot{I}_{k-1}$$

where,
D is $\cosh(\gamma l)$;
C is $-\sinh(\gamma l)/Zc$;
(a) k is the junction of interest;
(b) k−1 is the preceding junction;
with
(c) Zc being given by $\sqrt{(z_1/y_1)}$;
(d) γ being given by $\sqrt{(z1*y1)}$;
(e) l being the section length of transmission medium from the preceding junction to the junction of interest;
$z_1$ being the series impedance per unit length of the transmission medium from the preceding junction to the junction of interest; and
$y_1$ being the shunt admittance per unit length of the transmission medium from the preceding junction to the junction of interest.

Preferably the junction voltage at a junction of interest is calculated according to:

$$v_k(t) = [f_{k-1}(t-2Tc-Tz)*K + b_{k-1}(t-Tz)/K]/2$$

where $$f_{k-1}(t) = v_{k-1}(t) + zc*i_{k-1}(t-Tz); \text{ and}$$

$$b_{k-1}(t) = v_{k-1}(t) - zc*i_{k-1}(t-Tz)$$

and
k is the junction of interest;
k−1 is the preceding junction;

$$zc = \text{abs}(\text{sqrt}(z_1/y_1));$$

$$Tz = \text{phase }[\text{sqrt}(z_1/y_1)]/(2\pi f_0);$$

$$K = \exp[-\text{real}(\text{sqrt}(z_1*y_1)*1)]; \text{ and}$$

$$Tc = \text{imag}[(\text{sqrt}(z_1*y_1)*1)]/(2\pi f_0);$$

with
$f_0$ being the fundamental frequency of the electrical power system;
l being the section length of transmission medium from the preceding junction to the junction of interest;
$z_1$ being the series impedance per unit length of the transmission medium from the preceding junction to the junction of interest; and
$y_1$ being the shunt admittance per unit length of the transmission medium from the preceding junction to the junction of interest.

The junction voltage at a junction of interest could instead be calculated according to:

$$\dot{V}_k = A\dot{V}_{k-1} + B\dot{I}_{k-1}$$

where,
A is $\cosh(\gamma l)$;
B is $-Zc*\sinh(\gamma l)$;
(a) k is the junction of interest;
(b) k−1 is the preceding junction;
with
(c) Zc being given by $\sqrt{(z_1/y_1)}$;
(d) γ being given by $\sqrt{(z1*y1)}$;
(e) l being the section length of transmission medium from the preceding junction to the junction of interest;
$z_1$ being the series impedance per unit length of the transmission medium from the preceding junction to the junction of interest; and
$y_1$ being the shunt admittance per unit length of the transmission medium from the preceding junction to the junction of interest.

The preceding steps desirably permit the calculation of respective junction voltages in a manner which is readily scalable such that it is adaptable to all different topologies of multi-terminal, multi junction electrical power system.

Optionally extracting a respective junction time difference for the or each respective pair of adjacent junctions from a comparison of the calculated junction voltages of the or each said pair of adjacent junctions includes one of:
considering when the corresponding calculated junction voltages cross zero; and
utilising a Fourier transform method in the frequency time domain.

Either such step can be readily implemented, e.g. in a microcontroller based control unit, and is well-suited to identifying a time shift in sampled voltage waveforms of the type calculated herein in respect of each junction voltage.

The method of the invention preferably further includes the step of checking one or more determined communication time delays against a delay check value established by an echo-based process.

In a still further preferred embodiment of the invention the step of checking one or more determined communication time delays against a delay check value includes correcting the or each said determined communication time delay if the actual delay is more than one cycle of operation of the electrical power system.

The step of checking one or more determined communication time delays against a delay check value may include:
(a) determining a first communication time delay between a designated local terminal and a respective remote terminal;
(b) determining a second communication time delay with the respective remote terminal temporarily designated as the local terminal and the local terminal temporarily designated as the remote terminal;
(c) summing the first and second communication time delays;
(d) comparing the summed first and second communication time delays with twice the corresponding delay check value; and
(e) temporarily suspending further determination of communication time delays if the difference between the sum and twice the delay check value exceeds a predetermined threshold.

Carrying out such checks helps to maintain accurate and reliable operation of the method of the invention.

The method of the invention optionally further includes the steps of:
(a) temporarily suspending further determination of communication time delays when a fault condition is detected in the electrical power system; and
(b) relying on previously determined communication time delays during the fault condition.

Carrying out the aforementioned steps helps the method of the invention accurately and reliably ride through a fault condition.

The method of the invention may further include the steps of:
(a) checking whether a respective circuit breaker operatively associated with the local terminal and each remote terminal is closed; and
(b) determining respective communication time delays only if the local terminal circuit breaker is closed, and only then in respect of the or each remote terminal having an associated circuit breaker that is also closed.

Such steps help to avoid the determination of erroneous communication time delays during the initial operation of an electrical power system when respective circuit breakers are just closing and so may or may not be fully closed.

BRIEF DESCRIPTION OF THE DRAWINGS

There now follows a brief description of preferred embodiments of the invention, by way of non-limiting example, with reference being made to the following figures in which:
(a)

DETAILED DESCRIPTION

Figure 1:
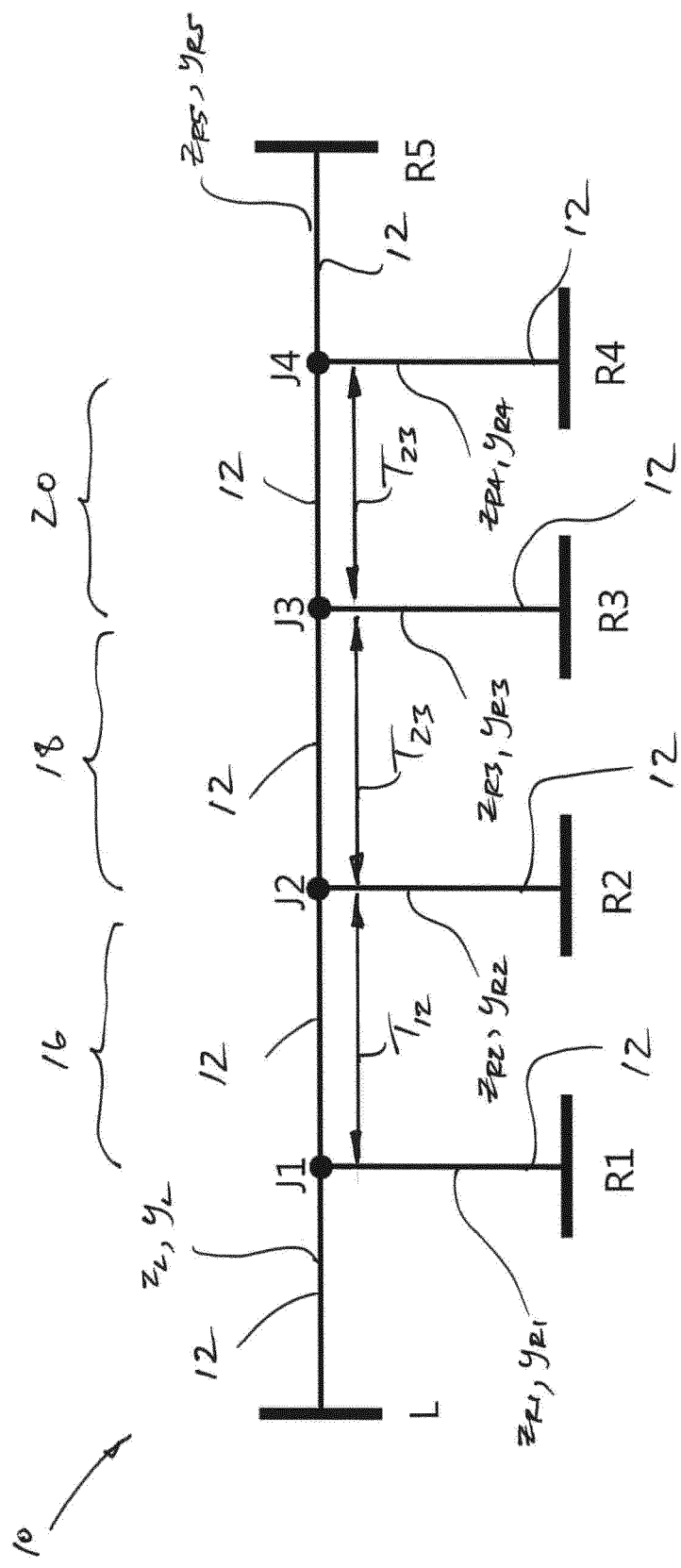
FIG. 1 shows a schematic representation of an example multi-terminal, multi-junction electrical power system;
(b)

An example multi-terminal, multi junction electrical power system is designated generally by reference numeral 10 and is shown schematically in FIG. 1.

The electrical power system 10 includes a local terminal L and first, second, third, fourth and fifth remote terminals R1, R2, R3, R4, R5 as well as first, second, third and fourth junctions J1, J2, J3, J4. The junctions J1, J2, J3, J4 interconnect respective remote terminals R1, R2, R3, R4, R5 with the local terminal L via respective portions of transmission medium 12, e.g. respective transmission lines or other transmission conduits.

Other multi-terminal, multi junction electrical power systems are also possible and the method of the invention is equally capable of operating in relation to these other electrical power systems. For example, the local terminal L need not necessarily be connected to the first junction J1.

Returning to the example electrical power system 10 shown, a method according to a first embodiment of the invention determines a respective communication time delay $14_{R1}$, $14_{R2}$, $14_{R3}$, $14_{R4}$, $14_{R5}$ in a communication network (not shown) between the local terminal L and each of the remote terminals R1, R2, R3, R4, R5.

Figure 2:
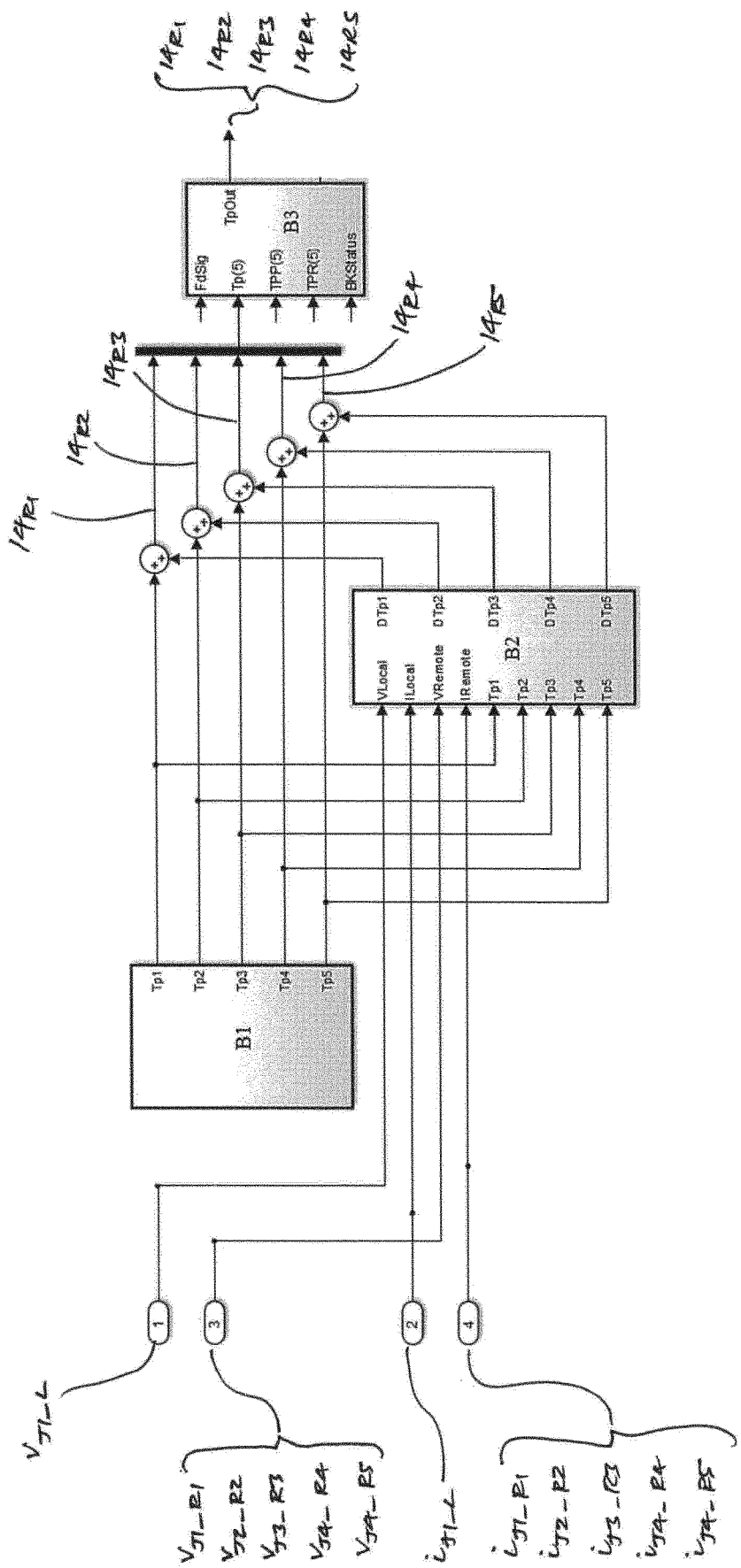
FIG. 2 shows a schematic view of an overall scheme of a method according to a first embodiment of the invention;
(c) FIG. 3($a$) shows a schematic representation of the electrical power system shown in FIG. 1 with a temporarily modified configuration;
(d) FIG. 3($b$) shows an equivalent version of the temporarily modified electrical power system shown in FIG. 3($a$) including equivalent admittances;
(e) FIG. 4($a$) shows various calculation sub-blocks which form a part of a second calculation block shown in FIG. 2;
(f) FIG. 4($b$) shows a first alignment block which forms a part of one of the calculation sub-blocks shown in FIG. 4($a$);
(g) FIG. 4($c$) shows an example scheme employed by the first alignment block shown in FIG. 4($b$);
(h)

The overall scheme of the method is illustrated schematically in FIG. 2 and comprises the principal steps of:
(a) calculating a respective initial communication time delay Tp1, Tp2, Tp3, Tp4, Tp5 between each remote terminal R1, R2, R3, R4, R5 and the local terminal L;
(b) calculating a respective junction time difference $T_{12}$, $T_{23}$, $T_{34}$ between respective first, second and third pairs 16, 18, 20 of adjacent junctions J1, J2, J3, J4; and
(c) correcting the calculated initial communication time delay Tp2, Tp3, Tp4, Tp5 of each remote terminal R2, R3, R4, R5 spaced from the local terminal L by two or more junctions J1, J2, J3, J4 according to each corresponding junction time delay $T_{12}$, $T_{23}$, $T_{34}$ arising between each said remote terminal R2, R3, R4, R5 and the local terminal L.

More particularly, step (a) of calculating a respective initial communication time delay Tp1, Tp2, Tp3, Tp4, Tp5 between each remote terminal R1, R2, R3, R4, R5 and the local terminal L is carried out by a first calculation block B1 and comprises the steps of:

selecting, in respect of each remote terminal R1, R2, R3, R4, R5 a calculation node in the electrical power system 10;
   (a) calculating respective node currents flowing into the corresponding calculation node from each remote terminal R1, R2, R3, R4, R5;
   (b) equating, in respect of each remote terminal R1, R2, R3, R4, R5 a sum of node currents flowing into the corresponding calculation node to zero according to Kirchhoff's first law; and
   (c) extracting, in respect of each remote terminal R1, R2, R3, R4, R5 an initial communication time delay Tp1, Tp2, Tp3, Tp4, Tp5 between the local terminal L and the said respective remote terminal R1, R2, R3, R4, R5 from a corresponding equated sum of node currents.

The same calculation node may be selected in respect of each remote terminal R1, R2, R3, R4, R5, and it may be any point within the respective portions of transmission medium 12 but, by way of example, is selected as being the first junction J1 lying closest to the local terminal L.

Figure 3A:
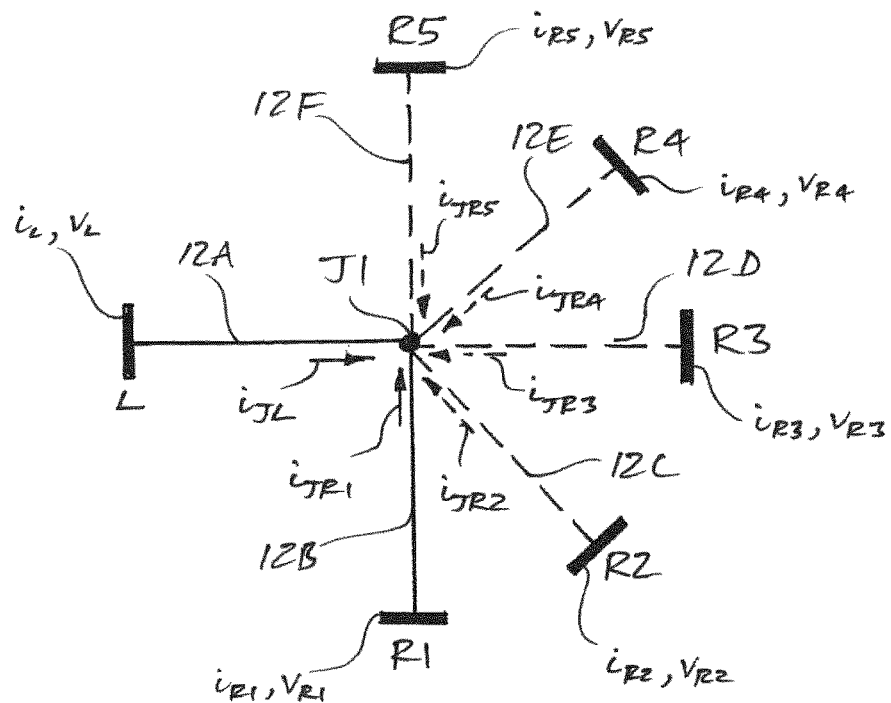

Such a selection is equivalent to assuming that each of the second, third, fourth and fifth remote terminals R2, R3, R4, R5 is temporarily connected to the first junction J1 (as shown in FIG. 3(a)) and thereby ignores the, as yet unknown, time delay that may arise in the transmission of data between the junctions J1, J2, J3, J4 themselves. As a result the calculation is intended to provide only an approximate, i.e. initial, communication time delay value representing the time delay in data being sent from each of the aforementioned remote terminals R2, R3, R4, R5 to the local terminal L.

The step of calculating respective node currents flowing into the corresponding calculation node, i.e. the first junction J1, from each remote terminal R1, R2, R3, R4, R5 involves various calculations in respect of each of the remote terminals R1, R2, R3, R4, R5.

More particularly, such calculations include calculating in respect of each remote terminal R1, R2, R3, R4, R5, i.e. at each remote terminal, a corresponding remote node current $i_{JR1}, i_{JR2}, i_{JR3}, i_{JR4}, i_{JR5}$ which is the current flowing into the corresponding calculation node, i.e. the first junction J1, from the said remote terminal R1, R2, R3, R4, R5.

Such calculations also include calculating in respect of the local terminal L, i.e. at the local terminal L, an equivalent node current $i_{JR1\_L}, i_{JR2\_L}, i_{JR3\_L}, i_{JR4\_L}, i_{JR5\_L}$ for each remote terminal R1, R2, R3, R4, R5 which is representative (from the perspective of the local terminal L) of the current flowing into the corresponding calculation node, i.e. the first junction J1, from the corresponding remote terminal R1, R2, R3, R4, R5.

More particularly still, a first remote node current $i_{JR1}$ which flows into the first junction J1, i.e. the calculation node, from the first remote terminal R1 is calculated in respect of the first remote terminal R1, i.e. is calculated at the first terminal R1 such that it is based on a time reference utilised by the first remote terminal R1.

Meanwhile a first equivalent node current $i_{JR1\_L}$ for the first remote terminal R1 is calculated in respect of the local terminal L, i.e. is calculated at the local terminal L such that it is based on a different time reference utilised by the local terminal L, and so is representative, from the perspective of the local terminal L, of the current flowing into the first junction J1 from the first remote terminal R1.

Similarly, a second remote node current $i_{JR2}$ which flows into the first junction J1 from the second remote terminal R2 is calculated in respect of the second remote terminal R2, i.e. is calculated at the second remote terminal R2, and a second equivalent node current $i_{JR2\_L}$ for the second remote terminal R1 is calculated in respect of the local terminal L, i.e. is calculated at the local terminal L, such that it is representative, from the perspective of the local terminal L, of the current flowing into the first junction J1 from the second remote terminal R2.

A third remote node current $i_{JR3}$ which flows into the first junction J1 from the third remote terminal R3 is calculated in respect of the third remote terminal R3, i.e. is calculated at the third remote terminal R3, and a third equivalent node current $i_{JR3\_L}$ for the third remote terminal R3 is calculated in respect of the local terminal L, i.e. is calculated at the local terminal L, such that it is representative, from the perspective of the local terminal L, of the current flowing into the first junction J1 from the third remote terminal R3.

A fourth remote node current $i_{JR4}$ which flows into the first junction J1 from the fourth remote terminal R4 is calculated in respect of the fourth remote terminal R4, i.e. is calculated at the fourth remote terminal R4, and a fourth equivalent node current $i_{JR4\_L}$ for the fourth remote terminal R4 is calculated in respect of the local terminal L, i.e. is calculated at the local terminal L, such that it is representative, from the perspective of the local terminal L, of the current flowing into the first junction J1 from the fourth remote terminal R4.

A fifth remote node current Las which flows into the first junction J1 from the fifth remote terminal R5 is calculated in respect of the fifth remote terminal R5, i.e. is calculated at the fifth remote terminal R5, and a fifth equivalent node current $i_{JR5\_L}$ for the fifth remote terminal R5 is calculated in respect of the local terminal L, i.e. is calculated at the local terminal L, such that it is representative, from the perspective of the local terminal L, of the current flowing into the first junction J1 from the fifth remote terminal R5.

Calculating the first, second, third, fourth and fifth remote node currents $i_{JR1}, i_{JR2}, i_{JR3}, i_{JR4}, i_{JR5}$ is carried out in a similar manner to that in which a local node current $i_{JL}$ is calculated, as described hereinbelow, and includes measuring the current $i_{R1}, i_{R2}, i_{R3}, i_{R4}, i_{R5}$ at each respective remote terminal R1, R2, R3, R4, R5 and using the measured current $i_{R1}, i_{R2}, i_{R3}, i_{R4}, i_{R5}$ to calculate the corresponding remote node current $i_{JR1}, i_{JR2}, i_{JR3}, i_{JR4}, i_{JR5}$ using an appropriate model of the corresponding equivalent section 12B, 12C, 12D, 12E, 12F of transmission medium 12 between the associated remote terminal R1, R2, R3, R4, R5 and the first junction J1, i.e. one of:
   (a) a resistor-inductor model;
   (b) a linear resistor-inductor-capacitor model; and
   (c) a distributed parameter model.

With regard to the appropriate model of the corresponding equivalent section 12B, 12C, 12D, 12E, 12F of transmission medium 12, the equivalent sections 12B, 12C, 12D, 12E, 12F shown in FIG. 3(a) are obtained by summing the actual individual sections of transmission medium 12 between the corresponding remote terminal R1, R2, R3, R4, R5 and the calculation node, i.e. the first junction J1. In addition, a shunt admittance y, propagation coefficient γ, and a character impedance $Z_C$ for each such equivalent section 12B, 12C, 12D, 12E, 12F can be determined in a similar manner from the impedance per length z and the shunt admittance per length y of the transmission medium 12, as provided by the operator of the respective section or sections of transmission medium 12.

The first remote node current $i_{JR1}$ is calculated by the first remote terminal R1 i.e. by a control unit located therein, the second remote node current $i_{JR2}$ is calculated by the second remote terminal R2, the third remote node current $i_{JR3}$ is calculated by the third remote terminal R3, the fourth remote node current $i_{JR4}$ is calculated by the fourth remote terminal R4, and the fifth remote node current $i_{JR5}$ is calculated by the fifth remote terminal R5.

In each instance the corresponding remote terminal R1, R2, R3, R4, R5 transmits to the local terminal L, via the communication network, the associated calculated remote node current $i_{JR1}$, $i_{JR2}$, $i_{JR3}$, $i_{JR4}$, $i_{JR5}$, whereat they are received as a respective first received remote node current a respective second received remote node current $i'_{JR2}$, a respective third received remote node current $i'_{JR3}$, a respective fourth received remote node current $i'_{JR4}$, and a respective a respective fifth received remote node current $i'_{JR5}$.

In this manner each received remote node current $i'_{JR1}$, $i'_{JR2}$, $i'_{JR3}$, $i'_{JR4}$, $i'_{JR5}$ embodies a corresponding initial communication time delay Tp1, Tp2, Tp3, Tp4, Tp5 between the associated remote terminal R1, R2, R3, R4, R5 and the local terminal L, i.e. a first initial communication time delay Tp1 between the first remote terminal R1 and the local terminal L, a second initial communication time delay Tp2 between the second remote terminal R2 and the local terminal L, a third initial communication time delay Tp3 between the third remote terminal R3 and the local terminal L, a fourth initial communication time delay Tp4 between the fourth remote terminal R4 and the local terminal L, and a fifth initial communication time delay Tp5 between the fifth remote terminal R5 and the local terminal L.

Each equivalent node current $i_{JR1\_L}$, $i_{JR2\_L}$, $i_{JR3\_L}$, $i_{JR4\_L}$, $i_{JR5\_L}$ is calculated by the local terminal L, and more particularly by a control unit located therein.

While the local terminal L, in calculating the first, second, third, fourth and fifth equivalent node currents $i_{JR1\_L}$, $i_{JR2\_L}$, $i_{JR3\_L}$, $i_{JR4\_L}$, $i_{JR5\_L}$, i.e. according to $$i_{JR1\_L} = i_{JL} + i_{JR2} + i_{JR3} + i_{JR4} + i_{JR5};$$

$$i_{JR2\_L} = i_{JL} + i_{JR1} + i_{JR3} + i_{JR4} + i_{JR5};$$

$$i_{JR3\_L} = i_{JL} + i_{JR1} + i_{JR2} + i_{JR4} + i_{JR5};$$

$$i_{JR4\_L} = i_{JL} + i_{JR1} + i_{JR2} + i_{JR3} + i_{JR5}; \text{ and}$$

$$i_{JR5\_L} = i_{JL} + i_{JR1} + i_{JR2} + i_{JR3} + i_{JR4};$$

could make use of the first, second, third, fourth and fifth received remote node currents $i'_{JR1}$, $i'_{JR2}$, $i'_{JR3}$, $i'_{JR4}$, $i'_{JR5}$, this would introduce five unknowns, i.e. the first, second, third, fourth and fifth communication time delays Tp1, Tp2, Tp3, Tp4, Tp5 at the next step, step (c), of equating to zero the sum of node currents flowing into the calculation node, i.e. the first junction J1, and thereby make it more difficult subsequently to extract each of the said communication time delays Tp1, Tp2, Tp3, Tp4, Tp5.

Consequently, in the embodiment of the method of the invention described herein, the step of calculating each of the first, second, third, fourth and fifth equivalent node currents $i_{JR1\_L}$, $i_{JR2\_L}$, $i_{JR3\_L}$, $i_{JR4\_L}$, $i_{JR5\_L}$ optionally includes:

establishing an equivalent admittance $y_{eR1}$, $y_{eR2}$, $y_{eR3}$, $y_{eR4}$, $y_{eR5}$ for each remote terminal R1, R2, R3, R4, R5; obtaining a local node current $i_{JL}$; and
utilising the established equivalent admittances $y_{eR1}$, $y_{eR2}$, $y_{eR3}$, $y_{eR4}$, $y_{eR5}$ for each remote terminal R1, R2, R3, R4, R5 and the local node current $i_{JL}$ to calculate the corresponding equivalent node current $i_{JR1\_L}$, $i_{JR2\_L}$, $i_{JR3\_L}$, $i_{JR4\_L}$, $i_{JR5\_L}$.

Figure 3B:
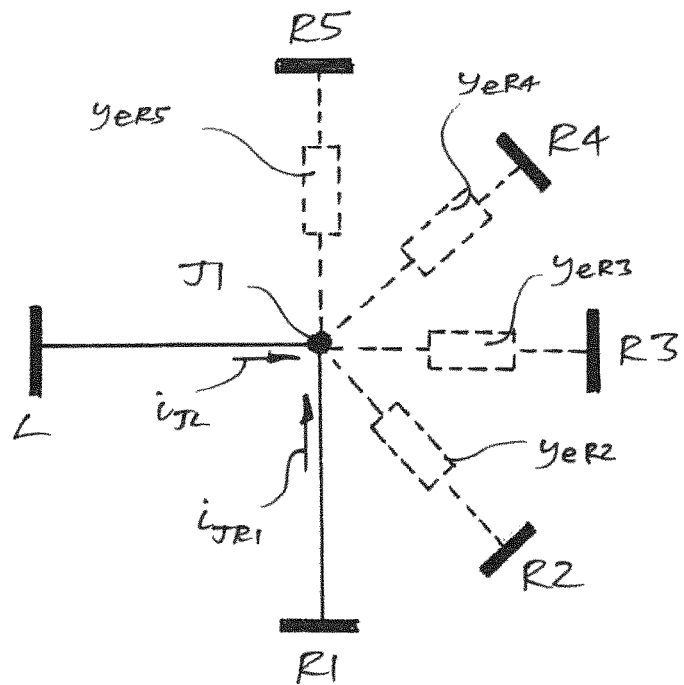

FIG. 3(b) shows one example of how each of the second, third, fourth and fifth remote node currents $i_{JR2}$, $i_{JR3}$, $i_{JR4}$, $i_{JR5}$ flowing respectively from the second, third, fourth and fifth remote terminals R2, R3, R4, R5 can be considered instead as a corresponding equivalent second, third, fourth and fifth admittance $y_{eR2}$, $y_{eR3}$, $y_{eR4}$, $y_{eR5}$.

The equivalent admittance $y_{eR1}$, $y_{eR2}$, $y_{eR3}$, $y_{eR4}$, $y_{eR5}$ for each remote terminal R1, R2, R3, R4, R5 may be established by a sample based method or a Fourier based method.

By way of example, the method of the invention utilises a Fourier based method whereby $$y_{eR1} = \frac{i'_{JR1}}{\dot{V}'_{JR1}}$$

$$y_{eR2} = \frac{i'_{JR2}}{\dot{V}'_{JR2}}$$

$$y_{eR3} = \frac{i'_{JR3}}{\dot{V}'_{JR3}}$$

$$y_{eR4} = \frac{i'_{JR4}}{\dot{V}'_{JR4}}$$

$$y_{eR5} = \frac{i'_{JR5}}{\dot{V}'_{JR5}}$$

where, $i'_{JR1}$ is the Fourier phasor of the first received remote node current $i'_{JR1}$ which embodies the first communication time delay Tp1 between the first remote terminal R1 and the local terminal L;

$\dot{V}'_{JR1}$ is the Fourier phasor of a first received remote node voltage $v'_{JR1}$ which is calculated by the first remote terminal R1 based on the voltage $v_{R1}$ measured at the first remote terminal R1 and which again embodies the first communication time delay Tp1;

$i'_{JR2}$ is the Fourier phasor of the second received remote node current $i'_{JR2}$ which embodies the second communication time delay Tp2 between the second remote terminal R2 and the local terminal L;

$\dot{V}'_{JR2}$ is the Fourier phasor of a second received remote node voltage $v'_{JR2}$ which is calculated by the second remote terminal R2 based on the voltage $v_{R2}$ measured at the second remote terminal R2 and which again embodies the second communication time delay Tp2;

$i'_{JR3}$ is the Fourier phasor of the third received remote node current $i'_{JR3}$ which embodies the third communication time delay Tp3 between the third remote terminal R3 and the local terminal L;

$\dot{V}'_{JR3}$ is the Fourier phasor of a third received remote node voltage $v'_{JR3}$ which is calculated by the third remote terminal R3 based on the voltage $v_{R3}$ measured at the third remote terminal R3 and which again embodies the third communication time delay Tp3;

$i'_{JR4}$ is the Fourier phasor of the fourth received remote node current $i'_{JR4}$ which embodies the fourth communication time delay Tp4 between the fourth remote terminal R4 and the local terminal L;

$\dot{V}'_{JR4}$ is the Fourier phasor of a fourth received remote node voltage $v'_{JR4}$ which is calculated by the fourth remote terminal R4 based on the voltage $v_{R4}$ measured at the fourth remote terminal R4 and which again embodies the fourth communication time delay Tp4;

$i'_{JR5}$ is the Fourier phasor of the fifth received remote node current $i'_{JR5}$ which embodies the fifth communication time delay Tp5 between the fifth remote terminal R5 and the local terminal L; and $\dot{V}'_{JR5}$ is the Fourier phasor of a fifth received remote node voltage $v'_{JR5}$ which is calculated by the fifth remote terminal R5 based on the voltage $v_{R5}$ measured at the fifth remote terminal R5 and which again embodies the fifth communication time delay Tp5.

Meanwhile the local node current $i_{JL}$ is obtained by measuring the current $i_L$ at the local terminal L and using the measured current $i_L$ at the local terminal L to calculate the local node current $i_{JL}$ using a resistor-inductor model of the section 12A of transmission medium 12 between the local terminal L and the first junction J1.

More particularly the section 12A of transmission medium 12 between the local terminal L and the first junction J1 is regarded as a resistor-inductor series-connected circuit and, because the section 12A is an overhead transmission line that is less than approximately 50 km, the shunt admittance can be neglected such that the local node current $i_{JL}$ is given by $$i_{JL} = i_L$$

A similar resistor-inductor model can be used in other embodiments of the method when applied to a network in which the corresponding section of transmission medium between the local terminal and the first junction, i.e. the calculation node, is defined by an underground cable that is less than approximately 3 km.

In other embodiments of the method of invention, when applied to a network in which the section of transmission medium between the local terminal and the first junction is defined either by an overhead transmission line between approximately 50 km and 150 km in length, or by an underground cable that is between approximately 3 km and 20 km in length, the local node current $i_{JL}$ can be obtained using a linear resistor-inductor-capacitor model of the aforesaid section of transmission medium, i.e. the parameters of resistance, inductance (or reactance) and shunt capacitance (or admittance) are considered to vary linearly along the said section. Such a linear resistor-inductor-capacitor model may also be known as a pi-equivalent circuit.

In such embodiments the local node current $i_{JL}$ can be obtained by a sample based method or by a Fourier phase based method.

In terms of the Fourier phase based method, the local node current $i_{JL}$ is given by $$\dot{I}_{JL} = \dot{I}_L - y_L \dot{V}_L / 2$$

where,
$\dot{I}_L$ is the Fourier phasor of measured current $i_L$ at the local terminal L;
$\dot{V}_L$ is the Fourier phasor of measured voltage $v_L$ at the local terminal L;
$\dot{I}_{JL}$ is the Fourier phasor of the local node current $i_{JL}$; and
$y_L$ is the shunt admittance of the section 12A of transmission medium 12 between the local terminal L and the calculation node, i.e. the first junction J1.

With regards to the last parameter, i.e. the shunt admittance $y_L$, this can be determined by multiplying the admittance per length (which can be obtained from the operator of the transmission medium 12) by the total length of the section 12A.

In still further embodiments of the method of invention, when applied to a network in which the section of transmission medium between the local terminal and the first junction is defined either by an overhead transmission line over approximately 150 km in length, or by an underground cable that is over approximately 20 km in length, the local node current $i_{JL}$ can be obtained using a distributed parameter model of the aforesaid section of transmission medium.

In such embodiments the local node current $i_{JL}$ can be obtained by a sample based method or by a Fourier phase based method, with the Fourier phase based method yielding the local node current $i_{JL}$ according to $$\dot{I}_{JL} = \cosh(\gamma D)\dot{I}_L - \sinh(\gamma D)\dot{V}_L/Z_C$$

where,
$\dot{I}_L$ is the Fourier phasor of measured current $i_L$ at the local terminal L;
$\dot{V}_L$ is the Fourier phasor of measured voltage $v_L$ at the local terminal L;

$$\gamma = \sqrt{zy}$$

is the propagation coefficient of the section of transmission medium, with z being the impedance per length and y being the shunt admittance per length of the transmission medium;

$$Z_C = \sqrt{z/y}$$

is the character impedance of the section of transmission medium, with z again being the impedance per length and y being the shunt admittance per length of the transmission medium; and
D is the length of the section of transmission medium between the local terminal L and the calculation node, i.e. the first junction J1.

Thereafter utilising the established equivalent admittances $y_{eR1}$, $y_{eR2}$, $y_{eR3}$, $y_{eR4}$, $y_{eR5}$ for each remote terminal R1, R2, R3, R4, R5 and the local node current $i_{JL}$ to calculate the corresponding first, second, third, fourth and fifth equivalent node currents $i_{JR1\_L}$, $i_{JR2\_L}$, $i_{JR3\_L}$, $i_{JR4\_L}$, $i_{JR5\_L}$ includes multiplying the local node current $i_{JL}$ by a current distribution coefficient based on the said established equivalent admittances $y_{eR1}$, $y_{eR2}$, $y_{eR3}$, $y_{eR4}$, $y_{eR5}$, i.e. according to $$\dot{I}_{JR1\_L} = \frac{y_{eR1}}{y_{eR1} + y_{eR2} + y_{eR3} + y_{eR4} + y_{eR5}} \dot{I}_{JL}$$

$$\dot{I}_{JR2\_L} = \frac{y_{eR2}}{y_{eR1} + y_{eR2} + y_{eR3} + y_{eR4} + y_{eR5}} \dot{I}_{JL}$$

$$\dot{I}_{JR3\_L} = \frac{y_{eR3}}{y_{eR1} + y_{eR2} + y_{eR3} + y_{eR4} + y_{eR5}} \dot{I}_{JL}$$

$$\dot{I}_{JR4\_L} = \frac{y_{eR4}}{y_{eR1} + y_{eR2} + y_{eR3} + y_{eR4} + y_{eR5}} \dot{I}_{JL}$$

$$\dot{I}_{JR5\_L} = \frac{y_{eR5}}{y_{eR1} + y_{eR2} + y_{eR3} + y_{eR4} + y_{eR5}} \dot{I}_{JL}$$

where,
$\dot{I}_{JR1\_L}$ is the Fourier phasor of the first equivalent node current $i_{JR1\_L}$;
$\dot{I}_{JR2\_L}$ is the Fourier phasor of the second equivalent node current $i_{JR2\_L}$;
$\dot{I}_{JR3\_L}$ is the Fourier phasor of the third equivalent node current $i_{JR3\_L}$;
$\dot{I}_{JR4\_L}$ is the Fourier phasor of the fourth equivalent node current $i_{JR4\_L}$;
$\dot{I}_{JR5\_L}$ is the Fourier phasor of the fifth equivalent node current $i_{JR5\_L}$; and
$\dot{I}_{JL}$ is the Fourier phasor of the local node current $i_{JL}$.

In other embodiments of the method of the invention, utilising the established equivalent admittances $y_{eR1}$, $y_{eR2}$, $y_{eR3}$, $y_{eR4}$, $y_{eR5}$ for each remote terminal R1, R2, R3, R4, R5 and the local node current $i_{JL}$ to calculate the corresponding first, second, third, fourth and fifth equivalent node currents $i_{JR1\_L}$, $i_{JR2\_L}$, $i_{JR3\_L}$, $i_{JR4\_L}$, $i_{JR5\_L}$ may include adding one or more other node currents, the or each of which is determined from the equivalent admittance $y_{eR1}$, $y_{eR2}$, $y_{eR3}$, $y_{eR4}$, $y_{eR5}$ of the other remote terminals R1, R2, R3, R4, R5 and a corresponding node voltage calculated in respect of the local terminal L, i.e. calculated at the local terminal L, to the local node current, i.e. according to $$\dot{I}_{JR1\_L} = \dot{I}_{JL} + (y_{eR2} + y_{eR3} + y_{eR4} + y_{eR5})\dot{V}_{JL}$$

$$\dot{I}_{JR2\_L} = \dot{I}_{JL} + (y_{eR1} + y_{eR3} + y_{eR4} + y_{eR5})\dot{V}_{JL}$$

$$\dot{I}_{JR3\_L} = \dot{I}_{JL} + (y_{eR1} + y_{eR2} + y_{eR4} + y_{eR5})\dot{V}_{JL}$$

$$\dot{I}_{JR4\_L} = \dot{I}_{JL} + (y_{eR1} + y_{eR2} + y_{eR3} + y_{eR5})\dot{V}_{JL}$$

$$\dot{I}_{JR5\_L} = \dot{I}_{JL} + (y_{eR1} + y_{eR2} + y_{eR3} + y_{eR4})\dot{V}_{JL}$$

where,
$\dot{I}_{JR1\_L}$ is the Fourier phasor of the first equivalent node current $i_{JR1\_L}$;
$\dot{I}_{JR2\_L}$ is the Fourier phasor of the second equivalent node current $i_{JR2\_L}$;
$\dot{I}_{JR3\_L}$ is the Fourier phasor of the third equivalent node current $i_{JR3\_L}$;
$\dot{I}_{JR4\_L}$ is the Fourier phasor of the fourth equivalent node current $i_{JR4\_L}$;
$\dot{I}_{JR5\_L}$ is the Fourier phasor of the fifth equivalent node current $i_{JR5\_L}$;
$\dot{I}_{JL}$ is the Fourier phasor of the local node current $i_{JL}$; and
$\dot{V}_{JL}$, is the Fourier phasor of a node voltage $v_{JL}$ which is expected at the calculation node, i.e. the first junction J1, and is calculated by the local terminal L based on a measured voltage $v_L$ at the local terminal L.

Thereafter, the step of equating, in respect of each remote terminal R1, R2, R3, R4, R5 a sum of node currents flowing into the calculation node, i.e. the first junction J1, to zero according to Kirchhoff's first law, includes:
for the first remote terminal R1, equating to zero the sum of the first calculated equivalent node current $i_{JR1\_L}$ and the first remote node current $i_{JR1}$;
for the second remote terminal R2, equating to zero the sum of the second calculated equivalent node current $i_{JR2\_L}$ and the second remote node current $i_{JR2}$;
for the third remote terminal R3, equating to zero the sum of the third calculated equivalent node current $i_{JR3\_L}$ and the third remote node current $i_{JR3}$;
for the fourth remote terminal R4, equating to zero the sum of the fourth calculated equivalent node current $i_{JR4\_L}$ and the fourth remote node current $i_{JR4}$; and
for the fifth remote terminal R5, equating to zero the sum of the fifth calculated equivalent node current $i_{JR5\_L}$ and the fifth remote node current $i_{JR5}$.

In other words, according to Kirchhoff's first law the sum of all currents flowing into the same node, i.e. the first junction J1, must be zero such that in respect of the first remote terminal R1

$$i_{JR1\_L} + i_{JR1} = 0$$

in respect of the second remote terminal R2

$$i_{JR2\_L} + i_{JR2} = 0$$

in respect of the third remote terminal R3

$$i_{JR3\_L} + i_{JR3} = 0$$

in respect of the fourth remote terminal R4

$$i_{JR4\_L} + i_{JR4} = 0$$

and in respect of the fifth remote terminal R5

$$i_{JR5\_L} + i_{JR5} = 0$$

Following the above, the step of extracting, in respect of each remote terminal R1, R2, R3, R4, R5 a corresponding initial communication time delay Tp1, Tp2, Tp3, Tp4, Tp5 between the local terminal L and the said respective remote terminal R1, R2, R3, R4, R5 from a corresponding equated sum of node currents, i.e. from a corresponding one of the sums set out above, includes considering the phase of the said node currents. This is because, in a similar manner as mentioned above in relation to the received remote node currents $i'_{JR1}$, $i'_{JR2}$, $i'_{JR3}$, $i'_{JR4}$, $i'_{JR5}$, the phasor of such received remote node currents $i'_{JR1}$, $i'_{JR2}$, $i'_{JR3}$, $i'_{JR4}$, $i'_{JR5}$ also embodies a corresponding initial communication time delay Tp1, Tp2, Tp3, Tp4, Tp5, but in a manner which is more readily extractable.

Accordingly, adopting a Fourier transform method to rewrite the sums set out above in a phasor form, and utilising respective phasors of the received remote node currents $i'_{JR1}$, $i'_{JR2}$, $i'_{JR3}$, $i'_{JR4}$, $i'_{JR5}$ to incorporate the corresponding initial communication time delay Tp1, Tp2, Tp3, Tp4, Tp5 gives, in respect of the first remote terminal R1

$$\dot{I}_{JR1\_L} + \dot{I}'_{JR1} e^{j\omega_0 T_{p1}} = 0$$

where,
$\dot{I}_{JR1\_L}$ is the Fourier phasor of the first equivalent node current $i_{JR1\_L}$;
$\dot{I}'_{JR1}$ is the Fourier phasor of the first received remote node current transmitted from the first remote terminal R1 to the local terminal L; and
f is frequency of the node currents $i_{JR1\_L}$, $i'_{JR1}$,
in respect of the second remote terminal R2

$$\dot{I}_{JR2\_L} + \dot{I}'_{JR2} e^{j\Omega_0 T_{p2}} = 0$$

where,
$\dot{I}_{JR2\_L}$ is the Fourier phasor of the second equivalent node current $i_{JR2\_L}$;
$\dot{I}'_{JR2\_L}$ is the Fourier phasor of the second received remote node current $i'_{JR2}$ transmitted from the second remote terminal R2 to the local terminal L; and
f is frequency of the node currents $i_{JR2\_L}$, $i'_{JR2}$,
in respect of the third remote terminal R3

$$\dot{I}_{JR3\_L} + \dot{I}'_{JR3} e^{j\Omega_0 T_{p3}} = 0$$

where,
$\dot{I}_{JR3\_L}$ is the Fourier phasor of the third equivalent node current $i_{JR3\_L}$;
$\dot{I}'_{JR3}$ is the Fourier phasor of the third received remote node current $i'_{JR3}$ transmitted from the third remote terminal R3 to the local terminal L; and
f is frequency of the node currents $i_{JR3\_L}$, $i'_{JR3}$,
in respect of the fourth remote terminal R4

$$\dot{I}_{JR4\_L} + \dot{I}'_{JR4} e^{j\Omega_0 T_{p4}} = 0$$

where,
$\dot{I}_{JR4\_L}$ is the Fourier phasor of the fourth equivalent node current $i_{JR4\_L}$;
$\dot{I}'_{JR4}$ is the Fourier phasor of the fourth received remote node current $i'_{JR4}$ transmitted from the fourth remote terminal R4 to the local terminal L; and
f is frequency of the node currents $i_{JR4\_L}$, $i'_{JR4}$, and
in respect of the fifth remote terminal R5

$$\dot{I}_{JR5\_L} + \dot{I}'_{JR5} e^{j\Omega_0 T_{p5}} = 0$$

where, $i_{JR5\_L}$ is the Fourier phasor of the fifth equivalent node current $i_{JR5\_L}$;

$i'_{JR5}$ is the Fourier phasor of the fifth received remote node current $i'_{JR5}$ transmitted from the fifth remote terminal R5 to the local terminal L; and f is frequency of the node currents $i_{JR5\_L}$, $i'_{JR5}$.

Each of the foregoing sums is then rearranged to give the corresponding initial communication time delay Tp1, Tp2, Tp3, Tp4, Tp5, i.e. such that the first initial communication time delay Tp1 is given by $$T_{p1} = \frac{\arg(-i_{JR1\_L}/i'_{JR1})}{2\pi f}$$

where arg gives the angle of the aforementioned Fourier phasors, the second initial communication time delay Tp2 is given by $$T_{p2} = \frac{\arg(-i_{JR2\_L}/i'_{JR2})}{2\pi f}$$

the third initial communication time delay Tp3 is given by $$T_{p3} = \frac{\arg(-i_{JR3\_L}/i'_{JR3})}{2\pi f}$$

the fourth initial communication time delay Tp4 is given by $$T_{p4} = \frac{\arg(-i_{JR4\_L}/i'_{JR4})}{2\pi f}$$

and such that the fifth initial communication time delay Tp5 is given by $$T_{p5} = \frac{\arg(-i_{JR5\_L}/i'_{JR5})}{2\pi f}$$

The next principal step, step (b), in the method of the invention requires the calculation of a respective junction time difference $T_{12}$, $T_{23}$, $T_{34}$ between each of the first, second and third pairs 16, 18, 20 of adjacent junctions J1, J2, J3, J4.

These calculations are carried out by a second calculation block B2, as shown in FIG. 2, and each calculation involves:
 (a) calculating for the local terminal L and each remote terminal R1, R2, R3, R4, R5 an expected voltage $v_{J1\_L}$, $v_{J1\_R1}$, $v_{J2\_R2}$, $v_{J3\_R3}$, $v_{J4\_R4}$, $v_{J4\_R5}$ at the junction J1, J2, J3, J4 with which it is connected;
 initially aligning the corresponding calculated expected voltage $v_{J1\_R1}$, $v_{J2\_R2}$, $v_{J3\_R3}$, $v_{J4\_R4}$, $v_{J4\_R5}$ of each remote terminal R1, R2, R3, R4, R5 with the calculated expected voltage $V_{J1\_L}$ at the local terminal L;
 (b) calculating for the local terminal L and each remote terminal R1, R2, R3, R4, R5 an expected current $i_{J1\_L}$, $i_{J1\_R1}$, $i_{J2\_R2}$, $i_{J3\_R3}$, $i_{J4\_R4}$, $i_{J4\_R5}$ at the junction J1, J2, J3, J4 with which it is connected;
 initially aligning the corresponding calculated expected current $i_{J1\_R1}$, $i_{J2\_R2}$, $i_{J3\_R3}$, $i_{J4\_R4}$, $i_{J4\_R5}$ of each remote terminal R1, R2, R3, R4, R5 with the calculated expected current $i_{J1\_L}$ at the local terminal L;
 (c) calculating a junction voltage at each junction J1, J2, J3, J4 based on the aforesaid initially aligned expected voltages and expected currents of the remote terminals R1, R2, R3, R4, R5 and the local terminal L; and
 (d) extracting a respective junction time difference $T_{12}$, $T_{23}$, $T_{34}$ for each respective pair 16, 18, 20 of adjacent junctions J1, J2, J3, J4 from a comparison of the calculated junction voltages of each said pair 16, 18, 20 of adjacent junctions J1, J2, J3, J4.

In the embodiment method described, the expected voltage at the junction with which each of the local terminal L and the remote terminals R1, R2, R3, R4, R5 is connected is calculated as follows, although other techniques are also possible.

For the local terminal L, the expected voltage at the first junction J1 is given by:

$$v_{J1\_L}(t) = [f_L(t - 2T_{cL} - T_{zL}) * K_L + b_L(t - T_{zL})/K_L]/2$$

where $$f_L(t) = v_L(t) + z_{cL} * i_L(t - T_{zL}); \text{ and}$$

$$b_L(t) = v_L(t) - z_{cL} * i_L(t - T_{zL})$$

with $$z_{cL} = \text{abs}(\text{sqrt}(z_L/y_L));$$

$$T_{zL} = \text{phase } [\text{sqrt}(z_L/y_L)]/(2\pi f_0);$$

$$K_L = \exp[-\text{real}(\text{sqrt}(z_L * y_L)]; \text{ and}$$

$$T_{cL} = \text{imag}[(\text{sqrt}(z_L * y_L))]//(2\pi f_0);$$

and where
 (a) $v_L$ is the measured voltage at the local terminal L;
 (b) $i_L$ is the measured current at the local terminal L;
 (c) $z_L$ is the known impedance of the transmission medium portion 12A connecting the local terminal L with the first junction J1; and
 (d) $y_L$ is the known admittance of the transmission medium portion 12A connecting the local terminal L with the first junction J1.

Similarly, for the first remote terminal R1 the expected voltage at the first junction J1 is given by:

$$v_{JR1\_R1}(t) = [f_{R1}(t - 2T_{cR1} - T_{zR1}) * K_{R1} + b_{R1}(t - T_{zR1})/K_{R1}]/2$$

where $$f_{R1}(t) = v_{R1}t) + Z_{cR1} * i_{R1}(t - T_{zR1}); \text{ and}$$

$$b_{R1}(t) = v_{R1}(t) - Z_{cR1} * i_{R1}(t - T_z R1),$$

with $$z_{cR1} = \text{abs}(\text{sqrt}(z_{R1}/y_{R1}));$$

$$T_{zR1} = \text{phase } [\text{sqrt}(z_{R1}/y_{R1})]/(2\pi f_0);$$

$$K_{R1} = \exp[-\text{real}(\text{sqrt}(z_{R1} * y_{R1})]; \text{ and}$$

$$T_{cR1} = \text{imag}[(\text{sqrt}(z_{R1} * y_{R1})]/(2\pi f_0);$$

and where
 (a) $v_{R1}$ is the measured voltage at the first remote terminal R1;
 (b) $i_{R1}$ is the measured current at the first remote terminal R1;

(c) $Z_{R1}$ is the known impedance of the actual transmission medium portion 12 connecting the first remote terminal R1 with the first junction J1; and (d) $y_{R1}$ is the known admittance of the actual transmission medium portion 12 connecting the first remote terminal R1 with the first junction J1.

Expected voltages at the corresponding junctions for the remaining remote terminals R2, R3, R4, R5 are similarly given by:

$$v_{J2\_R2}(t)=[f_{R2}(t-2T_{cR2}-T_{zR2})*K_{R2}+b_{R2}(t-T_{zR2})/K_{R2}]2$$

$$v_{J3\_R3}(t)=[f_{R3}(t-2T_{cR3}-T_{zR3})*K_{R3}+b_{R3}(t-T_{zR3})/K_{R3}]2$$

$$v_{J4\_R4}(t)=[f_{R4}(t-2T_{cR4}-T_{zR4})*K_{R4}+b_{R4}(t-T_{zR4})/K_{R4}]2$$

$$v_{J4\_R5}(t)=[f_{R5}(t-2T_{cR5}-T_{zR5})*K_{R5}+b_{R5}(t-T_{zR5})/K_{R5}]2$$

where $$f_{R2}(t)=v_{R2}(t)+Z_{cR2}*i_{R2}(t-T_{zR2}); \text{ and}$$

$$b_{R2}(t)=v_{R2}(t)-Z_{cR2}*i_{R2}(t-T_{zR2}),$$

$$f_{R3}(t)=v_{R3}(t)+Z_{cR2}*i_{R3}(t-T_{zR3}); \text{ and}$$

$$b_{R3}(t)=v_{R3}(t)-Z_{cR3}*i_{R3}(t-T_{zR3}),$$

$$f_{R4}(t)=v_{R4}(t)+Z_{cR4}*i_{R4}(t-T_{zR4}); \text{ and}$$

$$b_{R4}(t)=v_{R4}(t)-Z_{cR4}*i_{R4}(t-T_{zR4}),$$

$$f_{R5}(t)=v_{R5}(t)+Z_{cR5}*i_{R5}(t-T_{zR5}); \text{ and}$$

$$b_{R5}(t)=v_{R5}(t)-Z_{cR5}*i_{R5}(t-T_{zR5}),$$

(a) $v_{R2}$ is the measured voltage at the second remote terminal R2;

(b) $v_{R3}$ is the measured voltage at the third remote terminal R3;

(c) $v_{R4}$ is the measured voltage at the fourth remote terminal R4;

(d) $v_{R5}$ is the measured voltage at the fifth remote terminal R5

(e) $i_{R2}$ is the measured current at the second remote terminal R2;

(f) $i_{R3}$ is the measured current at the third remote terminal R3;

(g) $i_{R4}$ is the measured current at the fourth remote terminal R4;

(h) $i_{R5}$ is the measured current at the fifth remote terminal R5;

$z_{R2}$ is the known impedance of the actual transmission medium portion 12 connecting the second remote terminal R2 with the second junction J2;

$z_{R3}$ is the known impedance of the actual transmission medium portion 12 connecting the third remote terminal R3 with the third junction J3;

$z_{R4}$ is the known impedance of the actual transmission medium portion 12 connecting the fourth remote terminal R4 with the fourth junction J4;

$z_{R5}$ is the known impedance of the actual transmission medium portion 12 connecting the fifth remote terminal R5 with the fourth junction J4;

(i) $y_{R2}$ is the known admittance of the actual transmission medium portion 12 connecting the second remote terminal R2 with the second junction J1;

(j) $y_{R3}$ is the known admittance of the actual transmission medium portion 12 connecting the third remote terminal R3 with the third junction J3;

(k) $y_{R4}$ is the known admittance of the actual transmission medium portion 12 connecting the fourth remote terminal R4 with the fourth junction J4; and (l) $y_{R5}$ is the known admittance of the actual transmission medium portion 12 connecting the fifth remote terminal R5 with the fourth junction J4.

The expected current at the junction with which each of the local terminal L and the remote terminals R1, R2, R3, R4, R5 is connected is calculated as follows although, as with the calculation of expected voltages, other techniques are also possible.

For the local terminal L, the expected current at the first junction J1 is given by:

$$i_{J1\_L}(t)=[f_L(t-2T_{cL}-T_{zL})*K_L-b_L(t-T_{zL})/K_L]2z_{cL}$$

where $$f_L(t)=v_L(t)+z_{cL}*i_L(t-T_{zL}); \text{ and}$$

$$b_L(t)=v_L(t)-z_{cL}*i_L(t-T_{zL})$$

with $$z_{cL}=\text{abs}(\text{sqrt}(z_L/y_L));$$

$$T_{zL}=\text{phase }[\text{sqrt}(z_L/y_L)]/(2\pi f_0);$$

$$K_L=\exp[-\text{real}(\text{sqrt}(z_L*y_L))]; \text{ and}$$

$$T_{cL}=\text{imag}[(\text{sqrt}(z_L*y_L))]/(2\pi f_0);$$

and where $v_L$ is the measured voltage at the local terminal L;

(a) $i_L$ is the measured current at the local terminal L;

(b) $z_L$ is the known impedance of the actual transmission medium portion 12 connecting the local terminal L with the first junction J1; and (c) $y_L$ is the known admittance of the actual transmission medium portion 12 connecting the local terminal L with the first junction J1.

Similarly, for the first remote terminal R1 the expected current at the first junction J1 is given by:

$$i_{J1\_R1}(t)=[f_{R1}(t-2T_{cR1}-T_{zR1})*K_{R1}-b_{R1}(t-T_{zR1})/K_{R1}]2Z_{cR1}$$

where $$f_{R1}(t)=v_{R1}(t)+Z_{cR1}*i_{R1}(t-T_{zR1}); \text{ and}$$

$$b_{R1}(t)=v_{R1}(t)-Z_{cR1}*i_{R1}(t-T_{zR1}),$$

with $$z_{cR1}=\text{abs}(\text{sqrt}(z_{R1}/y_{R1}));$$

$$T_{zR1}=\text{phase }[\text{sqrt}(z_{R1}/y_{R1})]/(2\pi f_0);$$

$$K_{R1}=\exp[-\text{real}(\text{sqrt}(z_{R1}*y_{R1}))]; \text{ and}$$

$$T_{cR1}=\text{imag}[(\text{sqrt}(z_{R1}*y_{R1}))]/(2\pi f_0);$$

and where (a) $v_{R1}$ is the measured voltage at the first remote terminal R1;

(b) $i_{R1}$ is the measured current at the first remote terminal R1;

(c) $z_{R1}$ is the known impedance of the actual transmission medium portion 12 connecting the first remote terminal R1 with the first junction J1; and (d) $y_{R1}$ is the known admittance of the actual transmission medium portion 12 connecting the first remote terminal R1 with the first junction J1.

Expected currents at the corresponding junctions for the remaining remote terminals R2, R3, R4, R5 are similarly given by:

$$i_{J2\_R2}(t) = \frac{[f_{R2}(t-2T_{cR2}-T_{zR2})*K_{R2}-b_{R2}(t-T_{zR2})/K_{R2}]}{2z_{cR2}}$$

$$i_{J3\_R3}(t) = \frac{[f_{R3}(t-2T_{cR3}-T_{zR3})*K_{R3}-b_{R3}(t-T_{zR3})/K_{R3}]}{2z_{cR3}}$$

$$i_{J4\_R4}(t) = \frac{[f_{R4}(t-2T_{cR4}-T_{zR4})*K_{R4}-b_{R4}(t-T_{zR4})/K_{R4}]}{2z_{cR4}}$$

$$i_{J4\_R5}(t) = \frac{[f_{R5}(t-2T_{cR5}-T_{zR5})*K_{R5}-b_{R5}(t-T_{zR5})/K_{R5}]}{2z_{cR5}}$$

where $$f_{R2}(t) = v_{R2}(t) + z_{cR2}*i_{R2}(t-T_{zR2}); \text{ and}$$

$$b_{R2}(t) = v_{R2}(t) - z_{cR2}*i_{R2}(t-T_{zR2}),$$

$$f_{R3}(t) = v_{R3}(t) + z_{cR3}*i_{R3}(t-T_{zR3}); \text{ and}$$

$$b_{R3}(t) = v_{R3}(t) - z_{cR3}*i_{R3}(t-T_{zR3}),$$

$$f_{R4}(t) = v_{R4}(t) + z_{cR4}*i_{R4}(t-T_{zR4}); \text{ and}$$

$$b_{R4}(t) = v_{R4}(t) - z_{cR4}*i_{R4}(t-T_{zR4}),$$

$$f_{R5}(t) = v_{R5}(t) + z_{cR5}*i_{R5}(t-T_{zR5}); \text{ and}$$

$$b_{R5}(t) = v_{R5}(t) - z_{cR5}*i_{R5}(t-T_{zR5}),$$

$v_{R2}$ is the measured voltage at the second remote terminal R2;
  (a) $v_{R3}$ is the measured voltage at the third remote terminal R;
  (b) $v_{R4}$ is the measured voltage at the fourth remote terminal R4;
  (c) $v_{R5}$ is the measured voltage at the fifth remote terminal R5;
  (d) $i_{R2}$ is the measured current at the second remote terminal R2;
  (e) $i_{R3}$ is the measured current at the third remote terminal R3;
  (f) $i_{R4}$ is the measured current at the fourth remote terminal R4;
  (g) $i_{R5}$ is the measured current at the fifth remote terminal R5;
  $z_{R2}$ is the known impedance of the actual transmission medium portion 12 connecting the second remote terminal R2 with the second junction J2;
  $z_{R3}$ is the known impedance of the actual transmission medium portion 12 connecting the third remote terminal R3 with the third junction J3;
  $z_{R4}$ is the known impedance of the actual transmission medium portion 12 connecting the fourth remote terminal R4 with the fourth junction J4;
  $z_{R5}$ is the known impedance of the actual transmission medium portion 12 connecting the fifth remote terminal R5 with the fourth junction J4;
  (h) $y_{R2}$ is the known admittance of the actual transmission medium portion 12 connecting the second remote terminal R2 with the second junction J1;
  (i) $y_{R3}$ is the known admittance of the actual transmission medium portion 12 connecting the third remote terminal R3 with the third junction J3;
  (j) $y_{R4}$ is the known admittance of the actual transmission medium portion 12 connecting the fourth remote terminal R4 with the fourth junction J4; and
  (k) $y_{R5}$ is the known admittance of the actual transmission medium portion 12 connecting the fifth remote terminal R5 with the fourth junction J4.

Figure 4A:
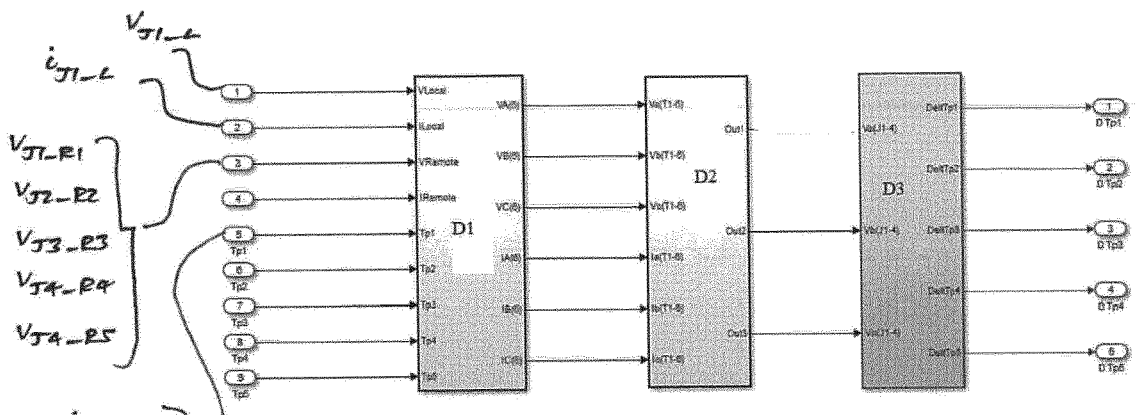

The initial alignment of the corresponding calculated expected voltage $v_{J1\_R1}$, $v_{J2\_R2}$, $v_{J3\_R3}$, $v_{J4\_R4}$, $v_{J4\_R5}$ of each remote terminal R1, R2, R3, R4, R5 with the calculated expected voltage $v_{J1\_L}$ at the local terminal L, and the initial alignment of the corresponding calculated expected current $i_{J1\_R1}$, $i_{J2\_R2}$, $i_{J3\_R3}$, $i_{J4\_R4}$, $i_{J4\_R5}$ of each remote terminal R1, R2, R3, R4, R5 with the calculated expected current $i_{J1\_L}$ at the local terminal L, is carried out by a first calculation sub-block D1, as shown in FIG. 4(a), which lies within the second calculation block B2.

The first calculation sub-block D1 is illustrated as handling first, second and third phases A, B, C, each of which has an associated calculated expected voltage and calculated expected current, as would arise in a three phase electrical power system. This is for illustrative purposes only and while the method of the invention is described in relation to a single phase, it can be applied equally to multi-phase electrical power systems, such as a three-phase system.

Figure 4B:
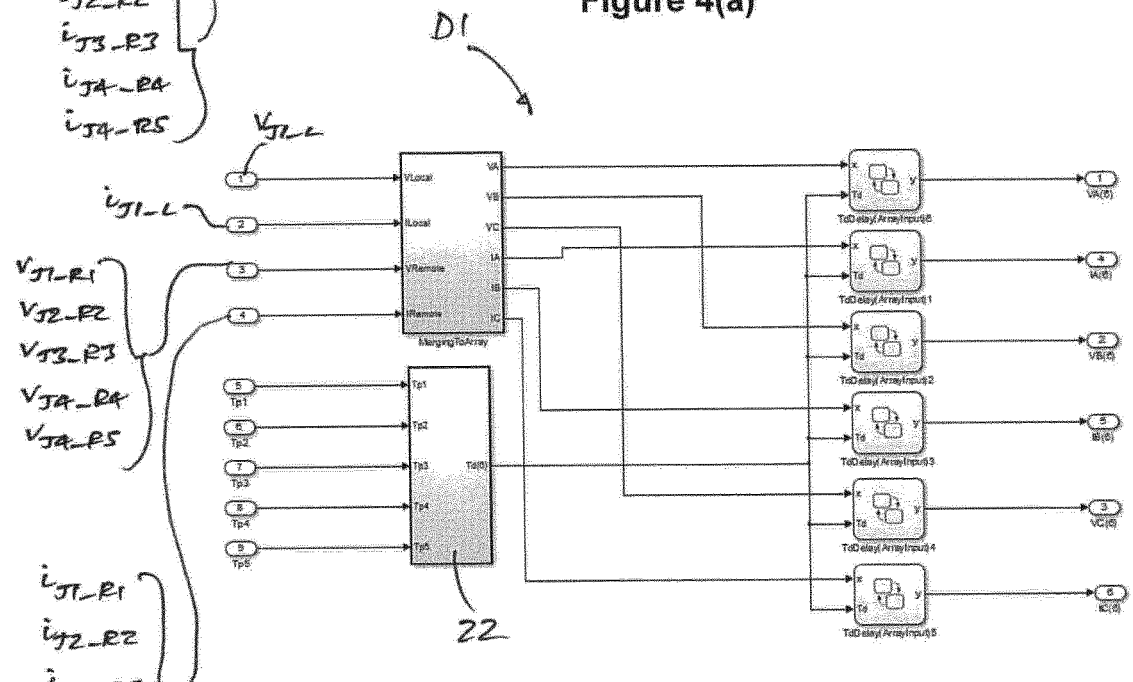

To carry out each of the aforementioned initial alignments the first calculation sub-block D1, and more particularly a first alignment block 22 (as shown in FIG. 4(b)) within the first calculation sub-block D1, first identifies the maximum initial communication time delay and then calculates a correction factor, in the form of a correction time, 24$_L$, 24$_{R1}$, 24$_{R2}$, 24$_{R3}$, 24$_{R4}$, 24$_{R5}$ for each of the calculated expected voltage $v_{J1\_L}$, $v_{J1\_R1}$, $v_{J2\_R2}$, $v_{J3\_R3}$, $v_{J4\_R4}$, $v_{J4\_R5}$ and the calculated expected current $i_{J1\_L}$, $i_{J1\_R1}$, $i_{J2\_R2}$, $i_{J3\_R3}$, $i_{J4\_R4}$, $i_{J4\_R5}$ of each terminal L, R1, R2, R3, R4, R5 by subtracting the corresponding initial communication time delay Tp1, Tp2, Tp3, Tp4, Tp5 for the said terminal L, R1, R2, R3, R4, R5 from the maximum initial communication time delay.

Figure 4C:
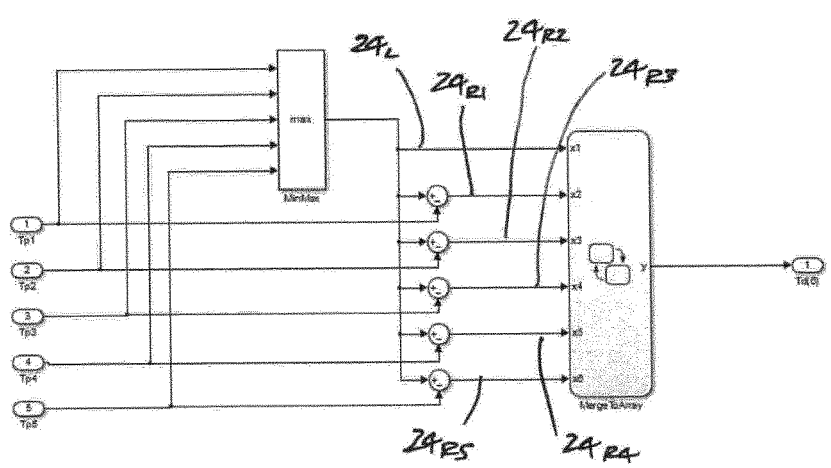

More particularly the first alignment block 22 employs the specific scheme illustrated schematically in FIG. 4(c) to calculate the required correction factors 24$_L$, 24$_{R1}$, 24$_{R2}$, 24$_{R3}$, 24$_{R4}$, 24$_{R5}$, although other schemes are also possible.

For example, for each of the calculated expected voltage $v_{J1\_R1}$ and calculated expected current $i_{J1\_R1}$ received from the first remote terminal R1, the correction factor for the time delay of these data is given by:

$$24_{R1} = T_{max} - Tp1$$

where
  (a) $T_{max}$ is the maximum initial communication time delay.

Meanwhile, for each of the calculated expected voltage $v_{J1\_L}$ and calculated expected current $i_{J1\_L}$ of the local terminal L, the correction factor is $$24_L = T_{max} - 0$$

The first calculation sub-block D1 then applies the correction factor 24$_L$, 24$_{R1}$, 24$_{R2}$, 24$_{R3}$, 24$_{R4}$, 24$_{R5}$ to the calculated expected voltage $v_{J1\_L}$, $v_{J1\_R1}$, $v_{J2\_R2}$, $v_{J3\_R3}$, $v_{J4\_R4}$, $v_{J4\_R5}$ and the calculated expected current $i_{J1\_L}$, $i_{J1\_R1}$, $i_{J2\_R2}$, $i_{J3\_R3}$, $i_{J4\_R4}$, $i_{J4\_R5}$ of each terminal L, R1, R2, R3, R4, R5, as also illustrated schematically in FIG. 4(b), to provide initially aligned expected voltages (not shown) and initially aligned expected currents (not shown) for all of the terminals L, R1, R2, R3, R4, R5.

Figure 5:
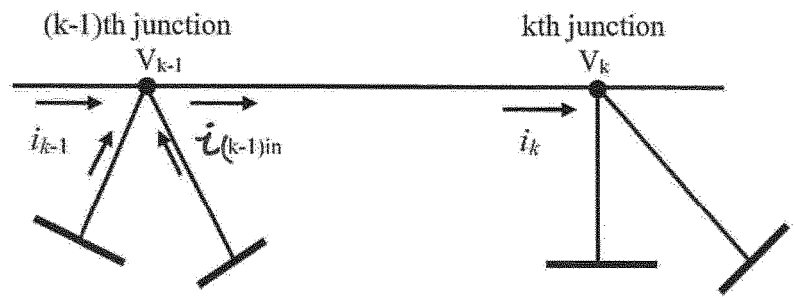
FIG. 5 illustrates schematically the calculation of a junction voltage of a particular junction of interest based on the voltage and current at a preceding junction;
(i)

Thereafter the calculation of a junction voltage at each junction J1, J2, J3, J4 based on the aforesaid initially aligned expected voltages and expected currents of all the terminals L, R1, R2, R3, R4, R5, is achieved by considering the voltage and current at a preceding junction J1, J2, J3, J4, i.e. the voltage and current at a $k^{th}$ junction of interest are calculated from the voltage and current at the preceding $(k-1)^{th}$ junction, as illustrated schematically in FIG. 5.

A second calculation sub-block D2 (as shown in FIG. 4(*a*)) carries out the junction voltage calculations in the following manner.

The current $I_{(k-1)in}$ provided by the preceding junction k−1 is calculated by summing the calculated expected current of the or each terminal L, R1, R2, R3, R4, R5 that is connected to the preceding junction k−1 with the current $i_{k-1}$ received from the previously preceding junction.

The number and identify of the or each terminal that is connected to each of the kth and k−1th junctions depends on the topology of the local and remote terminals L, R1, R2, R3, R4, R5 and associated junctions J1, J2, J3, J4, i.e. the topology of the associated electrical power system 10.

One way in which details of the topology for a given electrical power system can be recorded and utilised mathematically is by way of a topology matrix which, for the example electrical power system 10 shown in FIG. 1, presents the connection relationship of all terminals R1, R2, R3, R4, R5 and junctions J1, J2, J3, J4 in the following way:

|    | J1 | J2 | J3 | J4 |
|----|----|----|----|----|
| L  | 1  | 0  | 0  | 0  |
| R1 | 1  | 0  | 0  | 0  |
| R2 | 0  | 1  | 0  | 0  |
| R3 | 0  | 0  | 1  | 0  |
| R4 | 0  | 0  | 0  | 1  |
| R5 | 0  | 0  | 0  | 1  |

In this example, each row represents the terminal and each column represents a junction, and if a particular terminal R1, R2, R3, R4, R5 is connected on a given junction, e.g. the second remote terminal R2 is connected to the second junction J2, the cell of Row R2, Column J2 is populated with a 1, otherwise a zero is used.

It follows, by way of example, where the third junction J3 is the junction of interest for which a junction voltage is to be calculated, i.e. the third junction J3 is the $k^{th}$ junction, the current $I_{(k-1)in}$ provided by the second junction J2 is calculated by summing the initially aligned calculated expected currents of those terminals connected to the second junction J2, i.e. the calculated expected current $i_{J2\_R2}$ of the second remote terminal R2, with the current $i_{k-1}$ received from the first junction J1, i.e. the previously preceding junction.

Meanwhile, the current $i_{k-1}$ received from the first junction J1 is calculated according to:

$$i_{k-1}(t)=[f_{k-2}(t-2Tc)*K-b_{k-2}(t)/K]/2zc,$$

while the voltage $v_{k-1}$ of junction k−1, i.e. the second junction J2, is calculated according to:

$$v_{k-1}(t)=[f_{k-2}(t-2Tc)*K+b_{k-2}(t)/K]/2$$

where $$f_{k-2}(t)=v_{k-2}(t)+zc*i_{(k-2)in}(t-Tz); \text{ and}$$

$$b_{k-2}(t)=v_{k-2}(t)-zc*i_{(k-2)in}(t-Tz)$$

and k−1 is the second junction J2;
k−2 is the first junction J1;
$v_{k-2}$ is the average value of the initially aligned expected voltage of the or each terminal connected to the first junction J1 which is, because no other junction precedes the first junction, the average value of the calculated expected voltages of the local L and first remote R1 terminals;

$i_{(k-2)in}$ is the sum of initially aligned expected current of the or each terminal connected to the first junction J1, i.e. the sum of the expected current ink of the local terminal L and the expected current $i_{J1\_R1}$ of the first remote terminal R1;

$$zc=\text{abs}(\text{sqrt}(z_1/y_1));$$

$$Tz=\text{phase }[\text{sqrt}(z_1/y_1)]/(2\pi f_0);$$

$$K=\exp[-\text{real}(\text{sqrt}(z_1*y_1)*1)]; \text{ and}$$

$$Tc=\text{imag}[(\text{sqrt}(z_1*y_1)*1)]/(2\pi f_0);$$

with
$f_0$ being the fundamental frequency of the electrical power system;
l being the section length of the actual transmission medium 12 between the first and second junctions J1, J2;
$z_1$ being the series impedance per unit length of the actual transmission medium 12 between the first and second junctions J1, J2; and
$y_1$ being the shunt admittance per unit length of the actual transmission medium 12 between the first and second junctions J1, J2.

Thereafter the junction voltage, e.g. at the third junction J3, is calculated according to:

$$v_k(t)=[f_{k-1}(t-2Tc-Tz)*K+b_{k-1}(t-Tz)/K]/2$$

where $$f_{k-1}(t)=v_{k-1}(t)+zc*i_{(k-1)in}(t-Tz); \text{ and}$$

$$b_{k-1}(t)=v_{k-1}(t)-zc*i_{(k-1)in}(t-Tz)$$

and k is the third junction J3;
k−1 is second junction J2;
$v_{k-1}$ is the calculated junction voltage of the second junction J2 (which was calculated in the previous step)
$i_{(k-1)in}$ is the sum of the current $i_{k-1}$ provided by the second junction J2 (as calculated above) with the calculated expected currents of the terminals that are connected on the second junction J2, i.e. the calculated expected current $i_{J2\_R2}$ of the second remote terminal R2;

$$zc=\text{abs}(\text{sqrt}(z_1/y_1));$$

$$Tz=\text{phase }[\text{sqrt}(z_1/y_1)]/(2\pi f_0);$$

$$K=\exp[-\text{real}(\text{sqrt}(z_1*y_1)*1)]; \text{ and}$$

$$Tc=\text{imag}[(\text{sqrt}(z_1*y_1)*l)]/(2\pi f_0);$$

with
$f_0$ being the fundamental frequency of the electrical power system;
l being the section length of the actual transmission medium 12 between the second and third junctions J2, J3;
$z_1$ being the series impedance per unit length of the actual transmission medium 12 between the second and third junctions J2, J3; and
$y_1$ being the shunt admittance per unit length of the actual transmission medium 12 between the second and third junctions J2, J3.

As an alternative, the current and voltage at a junction of interest can be calculated according to:

$$\dot{I}_k C \dot{V}_{k-1} + D \dot{I}_{k-1}; \text{ and}$$

$$\dot{V}_k = A\dot{V}_{k-1} + B\dot{I}_{k-1}$$

where,
- A is $\cosh(\gamma l)$;
- B is $-Z_c \ast \sinh(\gamma l)$;
- D is $\cosh(\gamma l)$;
- C is $-\sinh(\gamma l)/Z_c$;
  - (a) k is the junction of interest; and
  - (b) k−1 is the preceding junction, with
- (c) $Z_c$ being given by $\sqrt{(z_1/y_1)}$;
- (d) $\gamma$ being given by $\sqrt{(z_1 \ast y_1)}$;
- (e) l being the section length of transmission medium from the preceding junction to the junction of interest;
- $z_1$ being the series impedance per unit length of the transmission medium from the preceding junction to the junction of interest; and
- $y_1$ being the shunt admittance per unit length of the transmission medium from the preceding junction to the junction of interest.

In any event, once a junction voltage has been calculated in the foregoing manner for each junction J1, J2, J3, J4, a respective junction time difference $T_{12}$, $T_{23}$, $T_{34}$ is extracted for each pair 16, 18, 20 of adjacent junctions J1, J2, J3, J4.

Figure 6:
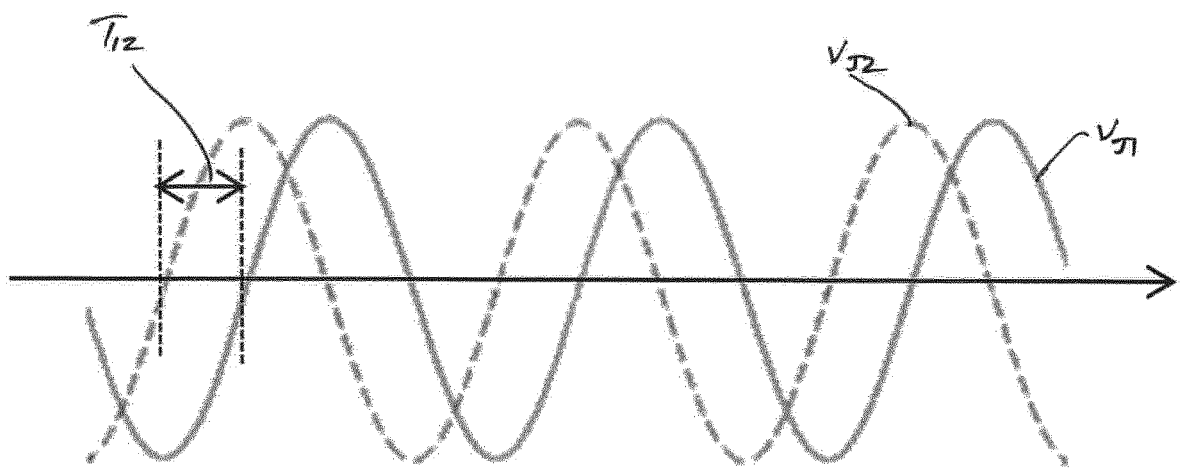
FIG. 6 shows a comparison of calculated junction voltages which forms a part of the method illustrated schematically in FIG. 2; and
(j)

Such extraction is carried out by comparing the calculated junction voltages of each said pair 16, 28, 20 of junctions J1, J2, J3, J4 and more particularly by considering when the corresponding calculated junctions voltages cross zero, e.g. as shown schematically in FIG. 6 by way of illustration for the calculated junction voltages $v_{J1}$, $v_{J2}$ of the first and second junctions J1, J2.

Following the extraction of a corresponding junction time difference $T_{12}$, $T_{236}$, $T_{34}$ for each pair 16, 18, 20 of adjacent junctions J1, J2, J3, J4 (i.e. a first junction time difference $T_{12}$ between the first and second junctions J1, J2; a second junction time difference $T_{23}$ between the second and third junctions J2, J3; and a third junction time difference $T_{34}$ between the third and fourth junctions J3, J4), the method of the invention then carries out principal step (c) of correcting the calculated initial communication time delay Tp1, Tp2, Tp3, Tp4, Tp5 of each remote terminal R1, R2, R3, R4, R5 spaced from the local terminal L by two or more junctions J1, J2, J3, J4 according to each corresponding junction time difference $T_{12}$, $T_{23}$, $T_{34}$ arising between each said remote terminal R1, R2, R3, R4, R5 and the local terminal L.

Correction of the calculated initial communication time delays Tp1, Tp2, Tp3, Tp4, Tp5 is carried out by calculation block B2, and more particularly by a third calculation sub-block D3 therewithin, as shown in FIG. 4(a).

The manner in which the calculated initial communication time delays Tp1, Tp2, Tp3, Tp4, Tp5 are to be corrected depends on the topology of the local and remote terminals L, R1, R2, R3, R4, R5 and associated junctions J1, J2, J3, J4.

As set out above, one way in which details of the topology for a given electrical power system can be recorded and utilised mathematically is by way of a topology matrix which, for the example electrical power system 10 shown in FIG. 1, takes the form

|    | J1 | J2 | J3 | J4 |
|----|----|----|----|----|
| L  | 1  | 0  | 0  | 0  |
| R1 | 1  | 0  | 0  | 0  |
| R2 | 0  | 1  | 0  | 0  |
| R3 | 0  | 0  | 1  | 0  |
| R4 | 0  | 0  | 0  | 1  |
| R5 | 0  | 0  | 0  | 1  |

In practice the third calculation sub-block D3 establishes a correction time DTp1, DTp2, DTp3, DTp4, DTp5 corresponding to each remote terminal R1, R2, R3, R4, R5, which is used to correct each of the corresponding calculated initial communication time delay Tp1, Tp2, Tp3, Tp4, Tp5. In this particular embodiment, however, the correction time DTp1 relating to the first remote terminal R1 turns out, as set out below, to be zero such that no correction of the calculated initial communication time delay Tp1 for the first remote terminal R1 arises.

The third calculation sub-block D3 then applies, i.e. adds, the correction time DTp1, DTp2, DTp3, DTp4, DTp5 to the corresponding calculated initial communication time delay Tp1, Tp2, Tp3, Tp4, Tp5, as shown schematically in FIG. 2, to determine the final, accurate communication time delay $14_{R1}$, $14_{R2}$, $14_{R3}$, $14_{R4}$, $14_{R5}$ for each remote terminal R1, R2, R3, R4, R5.

This final, accurate determined communication time delay $14_{R1}$, $14_{R2}$, $14_{R3}$, $14_{R4}$, $14_{R5}$ can then be used to synchronize the calculated expected local current $i_{J1\_L}$ at the local terminal L with the received calculated expected currents $i_{J1\_R1}$, $i_{J2\_R2}$, $i_{J3\_R3}$, $i_{J4\_R4}$, $i_{J4\_R5}$ from each remote terminal R1, R2, R3, R4, R5 and thereby permit operation of a differential protection scheme to protect the electrical power system 10.

Each correction time DTp1, DTp2, DTp3, DTp4, DTp5 is established by considering an associated compensation time of the junction J1, J2, J3, J4 with which the particular remote terminal R1, R2, R3, R4, R5 is connected. The compensation time is, in turn, dependent on the topology of the electrical power system 10, and more particularly is dependent on the relative position of the local terminal L.

In the electrical power system 10 shown in FIG. 1 the local terminal L is connected to the first junction J1 and so the compensation time $T_{J1}$, $T_{J2}$, $T_{J3}$, $T_{J4}$ for each of the first, second, third and fourth junctions J1, J2, J3, J4 is as follows
- (a) $T_{J1}=0$;
- (b) $T_{J2}=-T_{12}$ (i.e. minus the junction time difference between the first and second junctions J1, J2);
- (c) $T_{J3}=-(T_{12}+T_{23})$ (i.e. minus the sum of the junction time difference between the first and second junctions J1, J2 and the junction time difference between the second and third junctions J2, J3); and
- (d) $T_{J4}=-(T_{12}+T_{23}+T_{34})$ (i.e. minus the sum of the junction time difference between the first and second junctions J1, J2, the junction time difference between the second and third junctions J2, J3, and the junction time delay between the third and fourth junctions J3, J4).

The correction time DTp1, DTp2, DTp3, DTp4, DTp5 for each remote terminal R1, R2, R3, R4, R5 is equal to the compensation time of the junction J1, J2, J3, J4 to which the given remote terminal R1, R2, R3, R4, R5 is connected, such that the correction times are as follows:

$$DTp1=T_{J1}=0;$$

$$DTp2=T_{J2}=-T_{12};$$

$$DTp3=T_{J3}=-(T_{12}+T_{23});$$

$$DTp4=T_{J4}=-(T_{12}+T_{23}+T_{34});\text{ and}$$

$$DTp5=T_{J4}=-(T_{12}+T_{23}+T_{34}) \quad\quad (a)$$

Hence the final, accurate (i.e. corrected if necessary) determined communication time delay:
for the first remote terminal R1 is given by $$14_{R1}=Tp1+DTp1$$

$= Tp1 + 0$     i.

$= Tp1;$     ii.

for the second remote terminal R2 is given by $$14_{R2} = Tp2 + DTp2$$

$$= Tp2 + (-T_{12});$$     iii.

for the third remote terminal R3 is given by $$14_{R3} = Tp3 + DTp3$$

$$= Tp3 + (-(T_{12} + T_{23}));$$     iv.

for the fourth remote terminal R4 is given by $$14_{R4} = Tp4 + DTp4$$

$$= Tp4 + (-(T_{12} + T_{236} + T_{34})); \text{ and}$$     i.

for the fifth remote terminal R5 is given by $$14_{R5} = Tp5 + DTp5$$

$$= Tp5 + (-(T_{12} + T_{23} + T_{34}))$$     ii.

In an electrical power system similar to that shown in FIG. 1, but one in which the local terminal L is connected to the second junction J2, the compensation time $T_{J1}$, $T_{J2}$, $T_{J3}$, $T_{J4}$ for each of the first, second, third and junctions J1, J2, J3, J4 is instead determined as follows $$T_{J1} = T_{12};$$     (a)

$$T_{J2} = 0;$$     (b)

$$T_{J3} = -T_{23}; \text{ and}$$

$$T_{J4} = -(T_{23} + T_{34})$$     (c)

Moreover in a further electrical power system similar to that shown in FIG. 1, but one in which the local terminal L is connected to the third junction J3, the compensation time $T_{J1}$, $T_{J2}$, $T_{J3}$, $T_{J4}$ for each of the first, second, third and junctions J1, J2, J3, J4 is instead determined as follows $$T_{J1} = T_{12} + T_{23};$$     (a)

$$T_{J2} = T_{23};$$     (b)

$$T_{J3} = 0; \text{ and}$$

$$T_{J4} = -T_{34}$$     (c)

In a still further electrical power system similar to that shown in FIG. 1, but one in which the local terminal L is connected to the fourth junction J4, the compensation time $T_{J1}$, $T_{J2}$, $T_{J3}$, $T_{J4}$ for each of the first, second, third and junctions J1, J2, J3, J4 is instead determined as follows $$T_{J1} = T_{12} + T_{23} + T_{34};$$     (a)

$$T_{J2} = T_{23} + T_{34};$$     (b)

$$T_{J3} = T_{34}; \text{ and}$$

$$T_{J4} = 0$$     (c)

In further embodiments of the invention, one or both of principal steps (b) and (c) are repeated in order to improve further the accuracy of the determined communication time delays.

Figure 7:
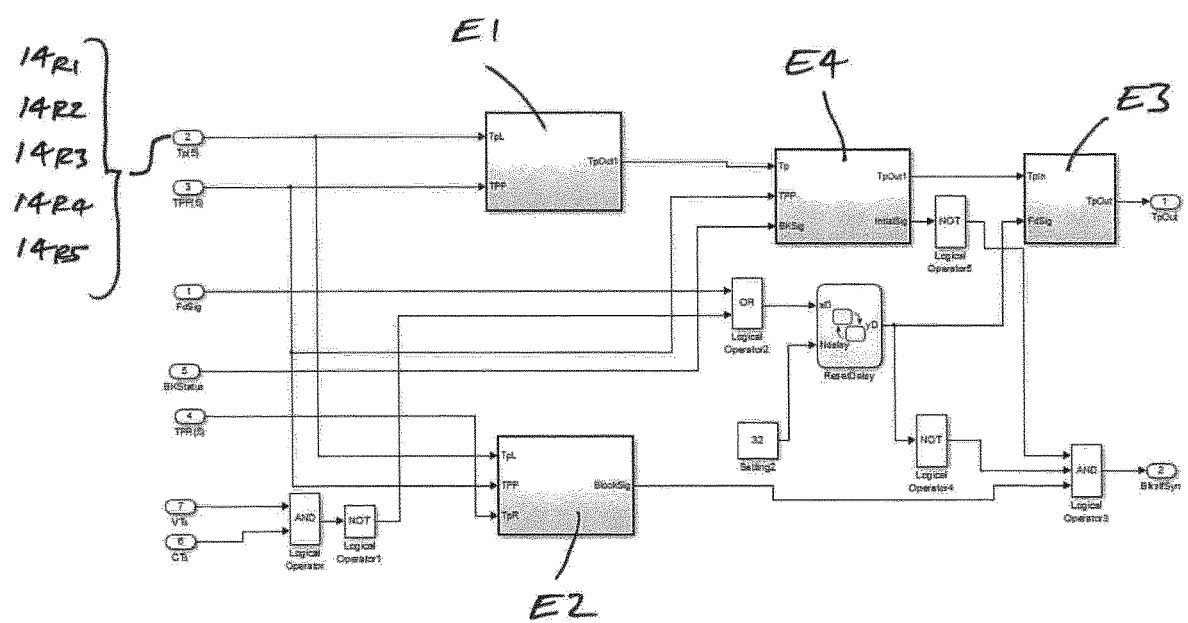
FIG. 7 shows a schematic view of a control scheme which forms a part of the overall scheme shown in FIG. 2.

In addition to the foregoing, the method of the invention also includes various supervisory and checking procedures which are carried out by a third calculation block B3 (as shown in FIG. 2) which implements a control scheme illustrated schematically in FIG. 7.

More particularly, the method of the invention includes the step of checking each of the final, accurate determined communication time delays $14_{R1}$, $14_{R2}$, $14_{R3}$, $14_{R4}$, $14_{R5}$ against a delay check value established by an echo-based process, and in particular a Ping-Pong technique. In other embodiments of the invention not all of the final, accurate determined communication time delays $14_{R1}$, $14_{R2}$, $14_{R3}$, $14_{R4}$, $14_{R5}$ need be checked.

In a first instance the checking is carried out by a first supervisory block E1 and includes establishing a delay check value in the form of a commensurate communication time delay TPP calculated by Ping-Pong. The first supervisory block E1 then checks whether the delay check value is nearly equal to one cycle of operation of the electrical power system 10.

If the delay check value is nearly equal to one cycle then this is indicative of the actual communication time delay being equal to the determined communication time delay $14_{R1}$, $14_{R2}$, $14_{R3}$, $14_{R4}$, $14_{R5}$ plus the time of one cycle.

In such circumstances, i.e. when the actual delay is more than one cycle of operation of the electrical power system 10, the first supervisory block E1 then additionally corrects the said determined communication time delay $14_{R1}$, $14_{R2}$, $14_{R3}$, $14_{R4}$, $14_{R5}$ accordingly.

For example, if the determined communication time delay $14_{R1}$, $14_{R2}$, $14_{R3}$, $14_{R4}$, $14_{R5}$ is calculated at 3 ms but the commensurate communication time delay TPP calculated by Ping-Pong, i.e. the delay check value, is 18 ms, then the actual communication time delay (for a system operating at 50 Hz and thereby having a cycle time of 20 ms) is corrected to:

$$3 \text{ ms} + 1*20 \text{ ms} = 23 \text{ ms}$$

In a second instance the checking is carried out by a second supervisory block E2 and includes:
(a) determining a first communication time delay TPL between the local terminal L and a respective remote terminal R1, R2, R3, R4, R5;
(b) determining a second communication time delay TPR with the respective remote terminal R1, R2, R3, R4, R5 temporarily designated as the local terminal and the local terminal L temporarily designated as the remote terminal;
(c) summing the first and second communication time delays;
(d) comparing the summed first and second communication time delays with twice the corresponding delay check value, i.e. twice the commensurate communication time delay TPP calculated by Ping-Pong; and
(e) temporarily suspending further determination of communication time delays $14_{R1}$, $14_{R2}$, $14_{R3}$, $14_{R4}$, $14_{R5}$ if the difference between the sum and twice the delay check value exceeds a predetermined threshold which, by way of example, could be 2.5 ms.

In practice temporary suspension of further determination of communication time delays $14_{R1}$, $14_{R2}$, $14_{R3}$, $14_{R4}$, $14_{R5}$ can be achieved by blocking the transmission of the determined communication time delays $14_{R1}$, $14_{R2}$, $14_{R3}$, $14_{R4}$, $14_{R5}$ to downstream equipment which would otherwise look to make use of them in implementing a differential protection scheme.

One supervisory procedure within the method of the invention is carried out by a third supervisory block E3 which temporarily suspends further determination of communication time delays $14_{R1}$, $14_{R2}$, $14_{R3}$, $14_{R4}$, $14_{R5}$ (e.g.

again by blocking the transmission of the determined communication time delays $14_{R1}$, $14_{R2}$, $14_{R3}$, $14_{R4}$, $14_{R5}$ to downstream equipment) when a fault condition is detected, e.g. by way of a fault detection signal FdSig in the electrical power system 10.

Under such circumstances the method of the invention relies on previously determined communication time delays, i.e. historical communication time delay values, during the fault condition. In practice this means that the aforementioned historical communication time delay values are instead transmitted to the downstream equipment (for use in operating the differential protection scheme) during the fault condition, and usually also for a short time after the fault condition is removed.

A further supervisory procedure within the method of the invention is carried out by a fourth supervisory block E4 which checks whether a respective circuit breaker (not shown) operatively associated with the local terminal L and each remote terminal R1, R2, R3, R4, R5 is closed, and determines respective communication time delays $14_{R1}$, $14_{R2}$, $14_{R3}$, $14_{R4}$, $14_{R5}$, e.g. allows such communication time delays $14_{R1}$, $14_{R2}$, $14_{R3}$, $14_{R4}$, $14_{R5}$ to be transmitted to downstream equipment, only if the local terminal L circuit breaker is closed, and only then in respect of the or each remote terminal R1, R2, R3, R4, R5 which has an associated circuit breaker that is also closed.

What we claim is:

1. A method of determining a communication time delay in a communication network between a local terminal and each of a plurality of remote terminals in a multi-terminal multi junction electrical power system, the method comprising:
    (a) calculating a respective initial communication time delay between each remote terminal and the local terminal;
    (b) calculating a respective junction time difference between the or each respective pair of adjacent junctions; and
    (c) correcting the calculated initial communication time delay of the or each remote terminal spaced from the local terminal by two or more junctions according to the or each corresponding junction time difference arising between the or each said remote terminal and the local terminal.

2. The method according to claim 1, wherein step (a) of calculating a respective initial communication time delay between each remote terminal and the local terminal includes:
    selecting, in respect of each remote terminal a calculation node in the electrical power system;
    calculating respective node currents flowing into the corresponding calculation node from each remote terminal;
    equating, in respect of each remote terminal, a sum of node currents flowing into the corresponding calculation node to zero according to Kirchhoff's first law; and
    extracting, in respect of each remote terminal, an initial communication time delay between the local terminal and the respective remote terminal from a corresponding equated sum of node currents.

3. The method according to claim 2, wherein the step of calculating respective node currents flowing into the corresponding calculation node from each remote terminal includes calculating in respect of each remote terminal a corresponding remote node current flowing into the corresponding calculation node from the remote terminal and calculating in respect of the local terminal an equivalent node current for each remote terminal representative of the current flowing into the corresponding calculation node from the corresponding remote terminal.

4. The method according to claim 3, wherein:
    each equivalent node current is calculated by the local terminal;
    each remote node current is calculated by the corresponding remote terminal and is thereafter transmitted via the communication network to the local terminal whereat each respective remote node current is received as a corresponding received remote node current; and
    the step of equating, in respect of each remote terminal, a sum of node currents flowing into the corresponding calculation node to zero according to Kirchhoff's first law, includes equating to zero in respect of each remote terminal the sum of the corresponding calculated equivalent node current and the corresponding remote node current.

5. The method of determining a communication time delay according to claim 3, wherein calculating in respect of the local terminal an equivalent node current for each remote terminal includes:
    establishing an equivalent admittance for each remote terminal;
    obtaining a local node current; and
    utilising the established equivalent admittances for each remote terminal and the local node current to calculate the corresponding equivalent node current.

6. The method according to claim 5, wherein utilising the established equivalent admittances for each remote terminal and the local node current to calculate each of the equivalent node currents includes one of:
    multiplying the local node current by a current distribution coefficient based on the established equivalent admittances; and
    adding one or more other node currents, the or each of which is determined from the equivalent admittance of another remote terminal and a corresponding node voltage calculated in respect of the local terminal, to the local node current.

7. The method according to claim 1, wherein step (b) of calculating a respective junction time difference between the or each respective pair of adjacent junctions includes:
    calculating for the local terminal and each remote terminal an expected voltage at the junction with which the junction is connected;
    initially aligning the corresponding calculated expected voltage of each remote terminal with the calculated expected voltage of the local terminal;
    calculating for the local terminal and each remote terminal an expected current at the junction with which the junction is connected;
    initially aligning the corresponding calculated expected current of each remote terminal with the calculated expected current of the local terminal;
    calculating a junction voltage at each junction based on the aforesaid initially aligned expected voltages and expected currents of the remote terminals and the local terminal; and
    extracting a respective junction time difference for the or each respective pair of adjacent junctions from a comparison of the calculated junction voltages of the or each said pair of adjacent junctions.

8. The method according to claim 7, wherein initially aligning the corresponding calculated expected voltage of each remote terminal with the calculated expected voltage at the local terminal and initially aligning the corresponding calculated expected current of each remote terminal with the calculated expected current at the local terminal includes:

identifying the maximum initial communication time delay;

calculating a correction factor for each of the calculated expected voltage and the calculated expected current of each terminal by subtracting the corresponding initial communication time delay for the terminal from the maximum initial communication time delay; and applying the corresponding correction factor to the calculated expected voltage and the calculated expected current of each terminal.

9. The method according to claim 7, wherein calculating a junction voltage at each junction based on the aforesaid initially aligned calculated expected voltages and expected currents of the remote terminals and the local terminal includes considering the voltage and current at a preceding junction.

10. The method according to claim 9, wherein considering the voltage and current at a preceding junction includes summing the calculated expected current of the or each terminal connected to the preceding junction with the current received from the previously preceding junction to calculate the current provided by the preceding junction to the junction of interest.

11. The method according to claim 10, wherein the current received from the previously preceding junction is calculated according to:

$$ik(t)=[fk-1(t-2Tc)*K-bk-1(t)/K]/2zc$$

where $$fk-1(t)=v_k-1(t)+zc*ik-1(t-Tz); \text{ and}$$

$$bk-1(t)=v_k-1(t)-zc*ik-1(t-Tz)$$

and
k is the junction of interest;
k−1 is the preceding junction;

$$zc=\text{abs}(\text{sqrt}(z_1/y_1));$$

$$Tz=\text{phase } [\text{sqrt}(z_1/y_1)]/(2\pi f0);$$

$$K=\exp[-\text{real}(\text{sqrt}(z1*y1)*1)]; \text{ and}$$

$$Tc=\text{imag}[(\text{sqrt}(z1*y1)*1)]//(2\pi f0);$$

with
f0 being the fundamental frequency of the electrical power system;
1 being the section length of transmission medium from the preceding junction to the junction of interest;
z1 being the series impedance per unit length of the transmission medium from the preceding junction to the junction of interest; and
y1 being the shunt admittance per unit length of the transmission medium from the preceding junction to the junction of interest.

12. The method according to claim 10, wherein the current received from the previously preceding junction is calculated according to:

$$I\_k=CV\_(k-1)+DI\_(k-1)$$

where,
D is $\cosh(\gamma 1)$;
C is $-\sinh(\gamma 1)/Zc$;
k is the junction of interest;
k−1 is the preceding junction;
with Zc being given by $\sqrt{(z1/y1)}$;
γ being given by $\sqrt{(z1*y1)}$;
1 being the section length of transmission medium from the preceding junction to the junction of interest;
z1 being the series impedance per unit length of the transmission medium from the preceding junction to the junction of interest; and
y1 being the shunt admittance per unit length of the transmission medium from the preceding junction to the junction of interest.

13. The method according to claim 9, wherein the junction voltage at a junction of interest is calculated according to:

$$v_k(t)=[fk-1(t-2Tc-Tz)*K+bk-1(t-Tz)/K]/2$$

where $$fk-1(t)=v_k-1(t)+zc*ik-1(t-Tz); \text{ and}$$

$$bk-1(t)=v_k-1(t)-zc*ik-1(t-Tz)$$

and
k is the junction of interest;
k−1 is the preceding junction;

$$zc=\text{abs}(\text{sqrt}(z1/y1));$$

$$Tz=\text{phase } [\text{sqrt}(z1/y1)]/(2\pi f0);$$

$$K=\exp[-\text{real}(\text{sqrt}(z1*y1)*1)]; \text{ and}$$

$$Tc=\text{imag}[(\text{sqrt}(z1*y1)*1)]/(2\pi f0);$$

with
f0 being the fundamental frequency of the electrical power system;
1 being the section length of transmission medium from the preceding junction to the junction of interest;
z1 being the series impedance per unit length of the transmission medium from the preceding junction to the junction of interest; and
y1 being the shunt admittance per unit length of the transmission medium from the preceding junction to the junction of interest.

14. The method according to claim 9, wherein the junction voltage at a junction of interest is calculated according to:

$$V\_k=AV\_(k-1)+BI\_(k-1)$$

where,
A is $\cosh(y1)$;
B is $-Zc*\sinh(y1)$;
k is the junction of interest;
k−1 is the preceding junction;
with
Zc being given by $\sqrt{(z1/y1)}$;
γ being given by $\sqrt{(z1*y1)}$;
1 being the section length of transmission medium from the preceding junction to the junction of interest;
z1 being the series impedance per unit length of the transmission medium from the preceding junction to the junction of interest; and
y1 being the shunt admittance per unit length of the transmission medium from the preceding junction to the junction of interest.

15. The method according to claim 7, wherein extracting a respective junction time difference for the or each respective pair of adjacent junctions from a comparison of the calculated junction voltages of the or each said pair of adjacent junctions includes one of: considering when the corresponding calculated junction voltages cross zero; and utilising a Fourier transform method in the frequency time domain.

16. The method according to claim 1, further including the step of checking one or more determined communication time delays against a delay check value established by an echo-based process.

17. The method according to claim 16, wherein the step of checking one or more determined communication time delays against a delay check value includes correcting the or each said determined communication time delay if the actual delay is more than one cycle of operation of the electrical power system.

18. The method according to claim 16, wherein the step of checking one or more determined communication time delays against a delay check value includes:
   determining a first communication time delay between a designated local terminal and a respective remote terminal;
   determining a second communication time delay with the respective remote terminal temporarily designated as the local terminal and the local terminal temporarily designated as the remote terminal;
   summing the first and second communication time delays;
   comparing the summed first and second communication time delays with twice the corresponding delay check value; and
   temporarily suspending further determination of communication time delays if the difference between the sum and twice the delay check value exceeds a predetermined threshold.

19. The method according to claim 1, further including the steps of:
   temporarily suspending further determination of communication time delays when a fault condition is detected in the electrical power system; and
   relying on previously determined communication time delays during the fault condition.

20. The method according to claim 1, further including the steps of:
   checking whether a respective circuit breaker operatively associated with the local terminal and each remote terminal is closed; and
   determining respective communication time delays only if the local terminal circuit breaker is closed, and only then in respect of the or each remote terminal having an associated circuit breaker that is also closed.

* * * * *